(12) United States Patent
Tsai et al.

(10) Patent No.: US 11,101,214 B2
(45) Date of Patent: Aug. 24, 2021

(54) PACKAGE STRUCTURE WITH DAM STRUCTURE AND METHOD FOR FORMING THE SAME

(71) Applicant: Taiwan Semiconductor Manufacturing Co., Ltd., Hsinchu (TW)

(72) Inventors: Po-Hao Tsai, Zhongli (TW); Techi Wong, Zhubei (TW); Meng-Liang Lin, Hsinchu (TW); Yi-Wen Wu, New Taipei (TW); Po-Yao Chuang, Hsin-Chu (TW); Shin-Puu Jeng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/380,502

(22) Filed: Apr. 10, 2019

(65) Prior Publication Data

US 2020/0211962 A1 Jul. 2, 2020

Related U.S. Application Data

(60) Provisional application No. 62/787,490, filed on Jan. 2, 2019.

(51) Int. Cl.
*H01L 23/495* (2006.01)
*H01L 23/528* (2006.01)
(Continued)

(52) U.S. Cl.
CPC ...... *H01L 23/5283* (2013.01); *H01L 23/3128* (2013.01); *H01L 23/3185* (2013.01);
(Continued)

(58) Field of Classification Search
CPC ............ H01L 23/3121; H01L 23/3128; H01L 23/3178; H01L 23/3185; H01L 23/49575; H01L 23/49861; H01L 23/5389; H01L 24/32; H01L 2224/32056; H01L 2224/3207; H01L 2224/32225; H01L 25/0657; H01L 25/074; H01L 2225/06517; H01L 2225/0652
See application file for complete search history.

(56) References Cited

U.S. PATENT DOCUMENTS 8,993,380 B2  3/2015  Hou et al.
9,281,254 B2  3/2016  Yu et al.
(Continued)

*Primary Examiner* — Stephen W Smoot
(74) *Attorney, Agent, or Firm* — Birch, Stewart, Kolasch & Birch, LLP

(57) ABSTRACT

A package structure and method for forming the same are provided. The package structure includes a die structure formed over a first interconnect structure, and the die structure includes a first region and a second region. The package structure includes a dam structure formed on the first region of the die structure, and a second interconnect structure formed over the die structure and the dam structure. The package structure also includes a package layer formed between the first interconnect structure and the second interconnect structure, and the package layer is formed on the second region of the die structure to surround the dam structure.

20 Claims, 34 Drawing Sheets

(51) Int. Cl.
  *H01L 23/00* (2006.01)
  *H01L 23/31* (2006.01)
  *H01L 25/00* (2006.01)
  *H01L 25/065* (2006.01)
  *H01L 23/498* (2006.01)
  *H01L 23/538* (2006.01)
  *H01L 25/07* (2006.01)

(52) U.S. Cl.
  CPC .. *H01L 23/49575* (2013.01); *H01L 23/49861* (2013.01); *H01L 23/5389* (2013.01); *H01L 24/09* (2013.01); *H01L 24/17* (2013.01); *H01L 24/32* (2013.01); *H01L 25/0657* (2013.01); *H01L 25/074* (2013.01); *H01L 25/50* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01); *H01L 2224/3207* (2013.01); *H01L 2224/32225* (2013.01); *H01L 2225/0652* (2013.01); *H01L 2225/06517* (2013.01); *H01L 2924/1436* (2013.01); *H01L 2924/1437* (2013.01)

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,859,255 | B1* | 1/2018 | Yoon ............... H01L 23/293 |
| 9,929,128 | B1* | 3/2018 | Cheng ............... H01L 24/97 |
| 2004/0212096 | A1* | 10/2004 | Wang ............... H01L 23/3128 257/777 |
| 2008/0211089 | A1* | 9/2008 | Khan ............... H01L 23/16 257/723 |
| 2013/0100616 | A1* | 4/2013 | Zohni ............... H01L 23/13 361/735 |
| 2013/0221470 | A1* | 8/2013 | Kinsman ......... H01L 27/14618 257/434 |
| 2016/0276312 | A1* | 9/2016 | Shimizu ............... H01L 24/27 |

\* cited by examiner

PACKAGE STRUCTURE WITH DAM STRUCTURE AND METHOD FOR FORMING THE SAME

CROSS REFERENCE TO RELATED APPLICATIONS

This Application claims the benefit of U.S. Provisional Application No. 62/787,490 filed on Jan. 2, 2019, and entitled "Package structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G' shows a cross-sectional representation of the package structure, in accordance with some embodiments of the disclosure.

DETAILED DESCRIPTION

Figure 1A:
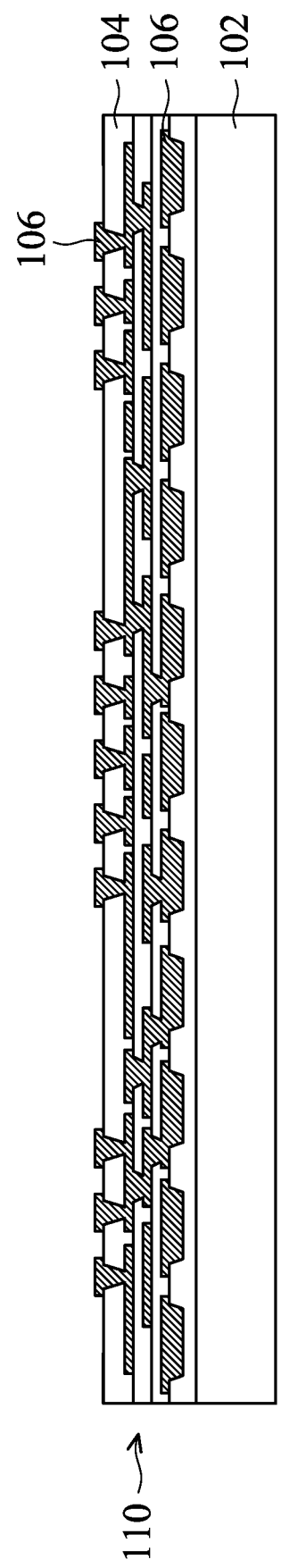
FIGS. 1A-1J show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a semiconductor device structure and method for forming the same are provided. FIGS. 1A-1J show cross-sectional representations of various stages of forming a package structure 300a, in accordance with some embodiments of the disclosure. The package structure 300a may be a package on package or another suitable package. A dam structure is formed over a die structure to support the top package structure above the dam structure. By forming the dam structure, a package material can easily fill into the gap between the first interconnect structure and the top package structure. Therefore, the problem of void formation can be resolved to improve the reliability of the package structure.

Referring to FIG. 1A, a carrier substrate 102 is provided. The carrier substrate 102 is configured to provide temporary mechanical and structural support during subsequent processing steps, in accordance with some embodiments. The carrier substrate 102 includes glass, silicon oxide, aluminum oxide, metal, a combination thereof, and/or the like, in accordance with some embodiments.

A first interconnect structure 110 is formed over the carrier substrate 102. The first interconnect structure 110 may be used as a redistribution (RDL) structure for routing. The first interconnect structure 110 includes multiple dielectric layers 104 and multiple conductive layers 106. In some embodiments, some of the conductive layers 106 are exposed at or protruding from the top surface of the top of the dielectric layers 104. The exposed or protruding conductive layers 106 may serve as bonding pads.

The dielectric layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layers 104 are made of or include dielectric materials other than polymer materials. The dielectric material may include silicon oxide, silicon carbide, silicon nitride, silicon oxynitride, one or more other suitable materials, or a combination thereof.

Figure 1B:
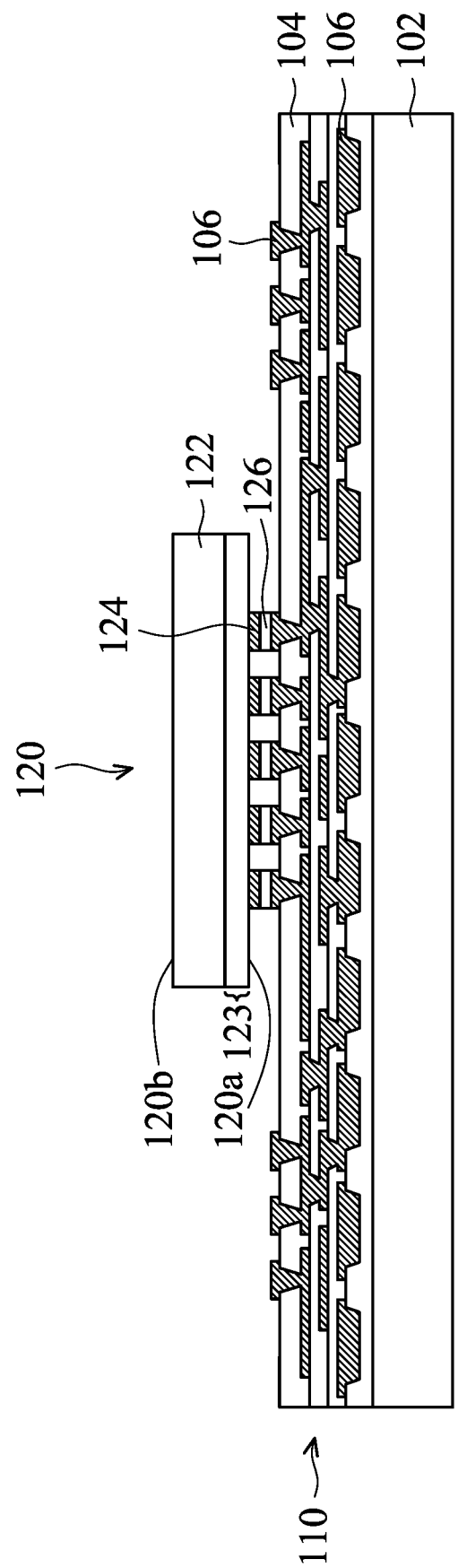

Afterwards, as shown in FIG. 1B, a first die structure 120 is formed over the carrier substrate 102, in accordance with some embodiments of the disclosure. The first die structure 120 includes a first surface 120a and a second surface 120b.

In some embodiments, the first die structure 120 is disposed over the carrier substrate 102. The first die structure 120 is sawed from a wafer, and may be a "known-good-die". In some embodiments, the first die structure 120 may be a system-on-chip (SoC) chip. In some other embodiments, the first die structure 120 is a system on integrated circuit (SoIC) device that includes two or more chips with integrated function. The first die structure 120 is disposed over the first interconnect structure 110. The first die structure 120 has a substrate 122, and an interconnect structure 123 is formed over the substrate 122. In some embodiments, the substrate 122 is silicon (Si) substrate. The interconnect structure 123 of the first die structure 120 includes multiple conductive layers or multiple conductive vias formed in the multiple dielectric layers.

In some embodiments, a number of conductive pads 124 are formed below the first die structure 120. The conductive pads 124 are formed on the first surface 120a of the first die structure 120, and conductive bumps (such as tin-containing solder bumps) and/or conductive pillars (such as copper pillars) will be formed later. Each of the conductive pads 124 is bonded to the conductive layer 106 of the first interconnect structure 110 through a conductive connector 126. The conductive pads 124 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 124 is formed by an electroplating, electroless plating, printing, chemical vapor deposition (CVD) process or physical vapor deposition (PVD) process. The conductive connector 126 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 126 is formed by electroplating, electroless plating, printing, chemical vapor deposition (CVD) process or physical vapor deposition (PVD) process.

Figure 1C:
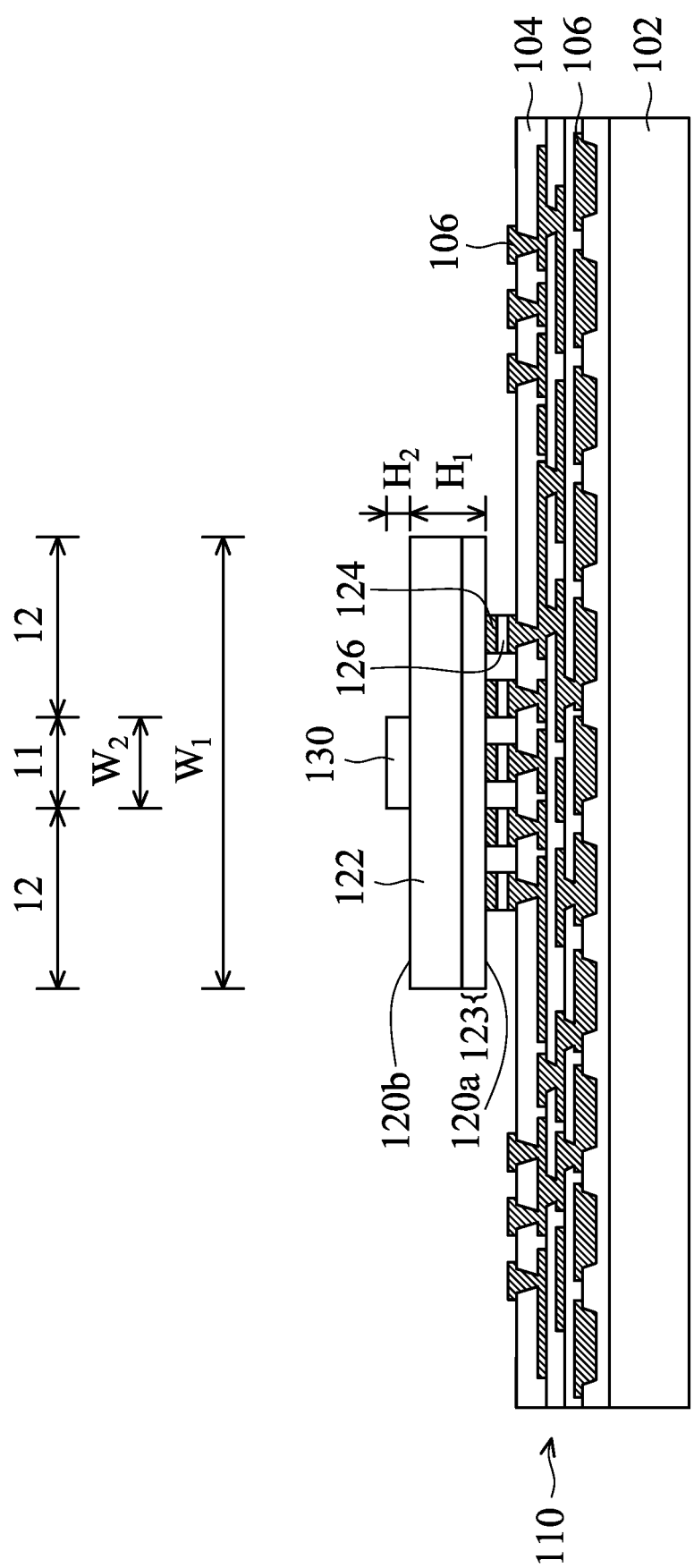

Afterwards, as shown in FIG. 1C, a dam structure 130 is formed over the first die structure 120, in accordance with some embodiments of the disclosure. The first die structure 120 includes a first region 11 and a second region 12. The dam structure 130 is formed on the first region 11 of the first die structure 120. In some embodiments, the first region 11 is a central region of the first die structure 120.

The dam structure 130 is formed on the second surface 120b of the first die structure 120. The dam structure 130 is configured to support the second interconnect structure 210 (formed later, shown in FIG. 1E).

In some embodiments, the dam structure 130 has a storage modulus strength in a range from about 1 Mpa to 50 MPa. In some embodiments, the dam structure 130 has a Coefficient of Thermal Expansion (CTE) in a range from about 100 ppm/° C. to about 200 ppm/° C. In some embodiments, the dam structure 130 is made of polyimide, acrylic copolymer, epoxy, or other applicable material.

The size of the dam structure 130 is smaller than or substantially equal to the size of the first die structure 120. It should be noted that the size of the dam structure 130 is not greater than the size of the first die structure 120. If the size of the dam structure 130 is greater than the size of the first die structure 120, the dam structure 130 may be peeled when the package layer 150 (formed later) is filled.

The first die structure 120 has a first width $W_1$ in the horizontal direction, and the dam structure 130 has a second width $W_2$ in the horizontal direction. In some embodiments, the second width $W_2$ is substantially equal to or smaller than the first width $W_1$. Where applicable, the term "substantially" may also relate to 90% or higher, such as 95% or higher, especially 99% or higher, including 100%. In some embodiments, the second width $W_2$ of the dam structure 130 is in a range from about 0.1 mm to about 10 mm.

The first die structure 120 has a first height $H_1$ in the vertical direction, and the dam structure 130 has a second height $H_2$ in the vertical direction. In some embodiments, the second height $H_2$ is smaller than the first height $H_1$. In some embodiments, the first height $H_1$ of the first die structure 120 is in a range from about 50 μm to about 150 μm. In some embodiments, the second height $H_2$ of the dam structure 130 is in a range from about 1 μm to about 50 μm. When the second width $W_2$ and the second height $H_2$ of the dam structure 130 are within above-mentioned range, the dam structure 130 can effectively support a second interconnect structure 210 (formed later, as shown in FIG. 1E).

In some embodiments, the dam structure 130 is formed by a printing process or a dispensing process or a tapping process. In some other embodiments, the dam structure 130 is formed at another location to have fixed shape, and then is adhered to the second surface 120b of the first die structure 120.

Figure 1D:
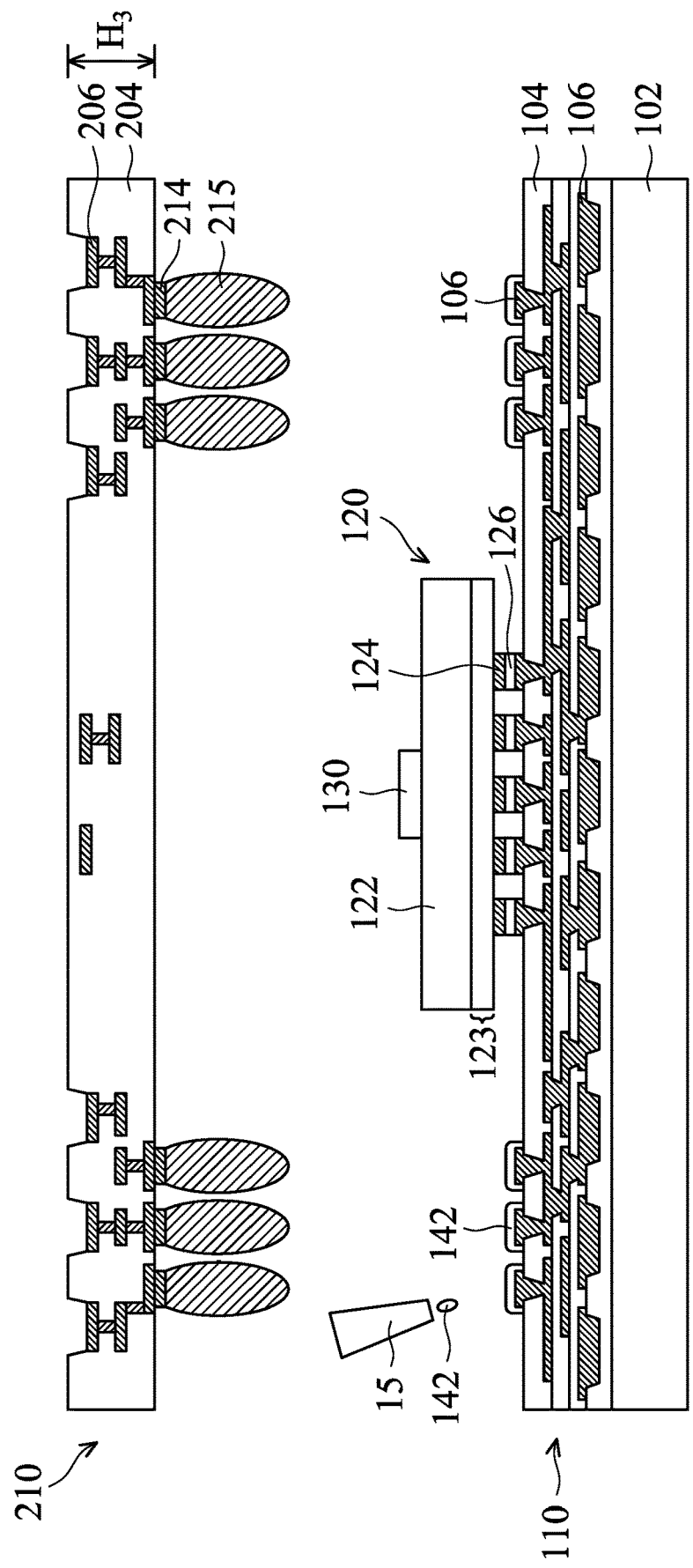
Figure 1E:
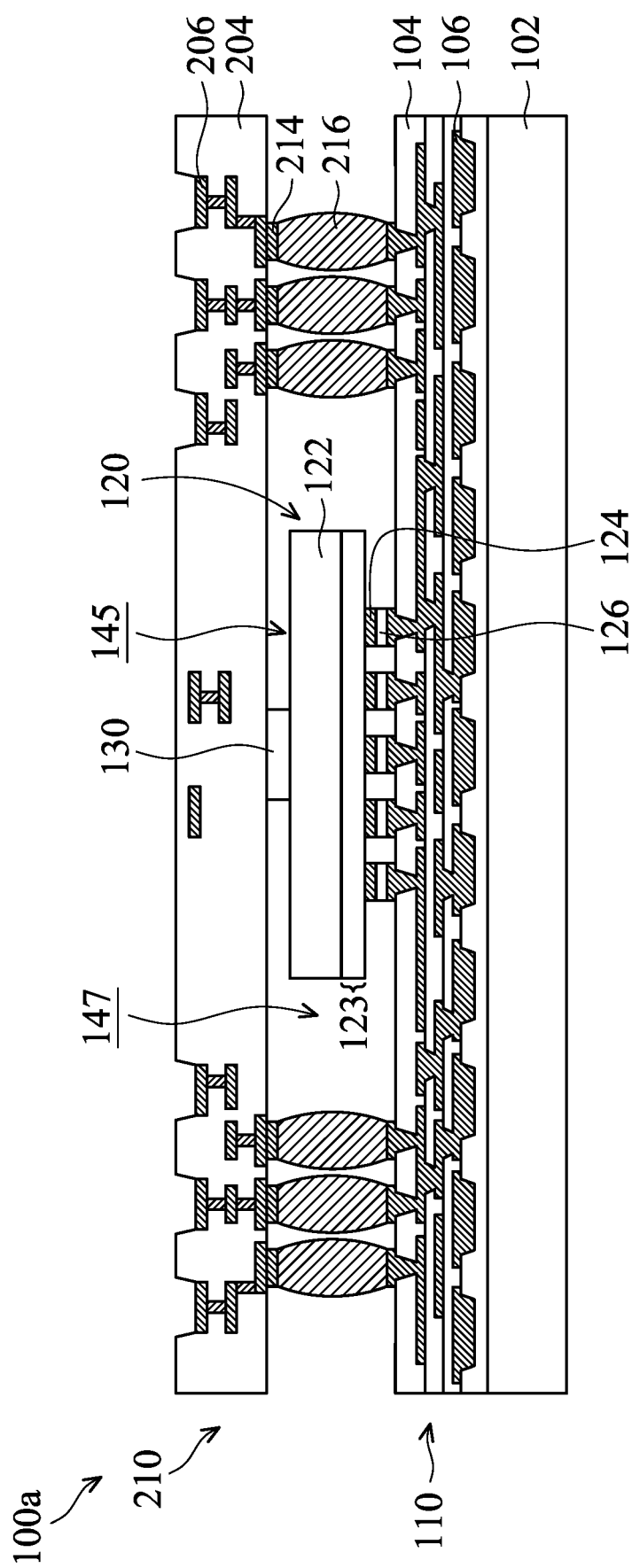

Next, as shown in FIG. 1D, a flux 142 is dispersed from a dispensing nozzle 15, in accordance with some embodiments of the disclosure. In addition, the second interconnect structure 210 is disposed over the first die structure 120.

The flux 142 is configured to clean surface oxides from the conductive pads during the reflow bonding of the conductive connector (such as solder balls) to the conductive pads. The flux may include an electrically insulating polymer resin such as an epoxy resin, a silicone resin, natural rubber, synthetic rubber, or another applicable material. The dispensing nozzle 15 configured to deposit the flux material on the conductive layer 106.

The second interconnect structure 210 may be used as a second redistribution (RDL) structure for routing. The second interconnect structure 210 includes multiple dielectric layers 204 and multiple conductive layers 206. The materials and manufacturing method for forming the multiple dielectric layers 204 and multiple conductive layers 206 are the same as, or similar to, the materials and manufacturing method for forming the multiple dielectric layers 104 and multiple conductive layers 106, and therefore the descriptions thereof are omitted for brevity.

A number of conductive pads 214 are formed below the second interconnect structure 210. A number of the conductive connectors 215 are formed over the conductive pads 214. The materials and manufacturing method for forming the conductive pads 214 and the conductive connectors 215 are the same as, or similar to, the materials and manufacturing method for forming the conductive pads 124 and the conductive connectors 126, and the descriptions thereof are therefore omitted for brevity.

The second interconnect structure 210 has a third height $H_3$. In some embodiments, the third height $H_3$ is in a range from about 40 μm to about 150 μm.

Afterwards, as shown in FIG. 1E, the second interconnect structure 210 is disposed over on the dam structure 130, in accordance with some embodiments of the disclosure. The second interconnect structure 210 is bonded to the first interconnect structure 110 by bonding the conductive connector 215 to the flux 142 to form a conductive connector 216 (or joint connector). The conductive layer 206 of the second interconnect structure 210 is electrically connected to the conducive layer 106 of the first interconnect structure 110 by the conductive connector 216.

The dam structure 130 is in direct contact with the second interconnect structure 210. In some embodiments, the dam structure 130 is located on a central area of the second surface 120b of the first die structure 120. A gap 145 is formed between the first die structure 120 and the second interconnect structure 210. A space 147 is formed between the first interconnect structure 110 and the second interconnect structure 210.

Figure 1F:
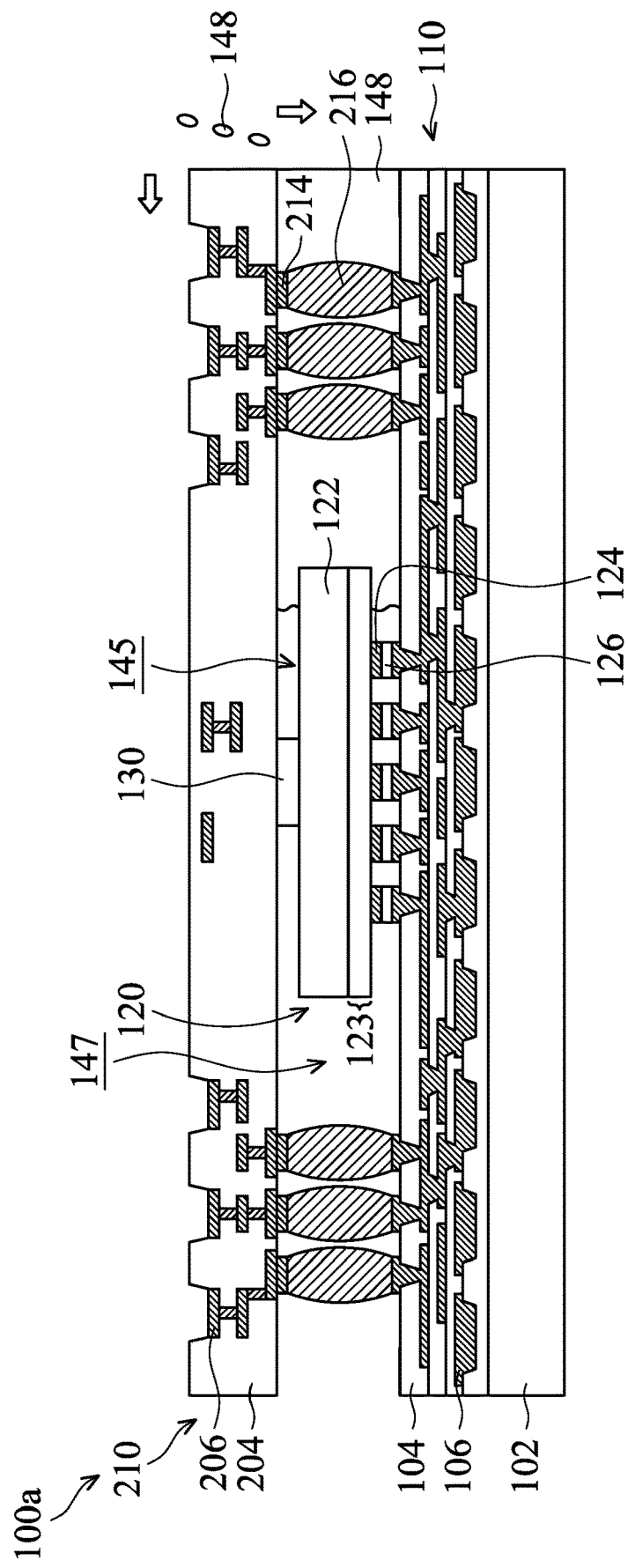

Afterwards, as shown in FIG. 1F, a molding compound material 148 fill from a first side of the first die structure 120, in accordance with some embodiments of the disclosure. The molding compound material 148 surrounds and protects the conductive connector 216.

The molding compound material 148 and the dam structure 130 are made of different materials. Therefore, an interface (boundary or junction) is between the molding compound material 148 and the dam structure 130. The molding compound material 148 may include a polymer material, such as an epoxy-based resin with fillers dispersed therein. In some embodiments, a liquid molding compound material 148 is applied over the first die structure 120. The liquid molding compound material 148 may flow into the space 147 between the first interconnect structure 110 and the second interconnect structure 210. A thermal process is then used to cure the liquid molding compound material 148 and to transform it into the package layer 150.

Figure 1G:
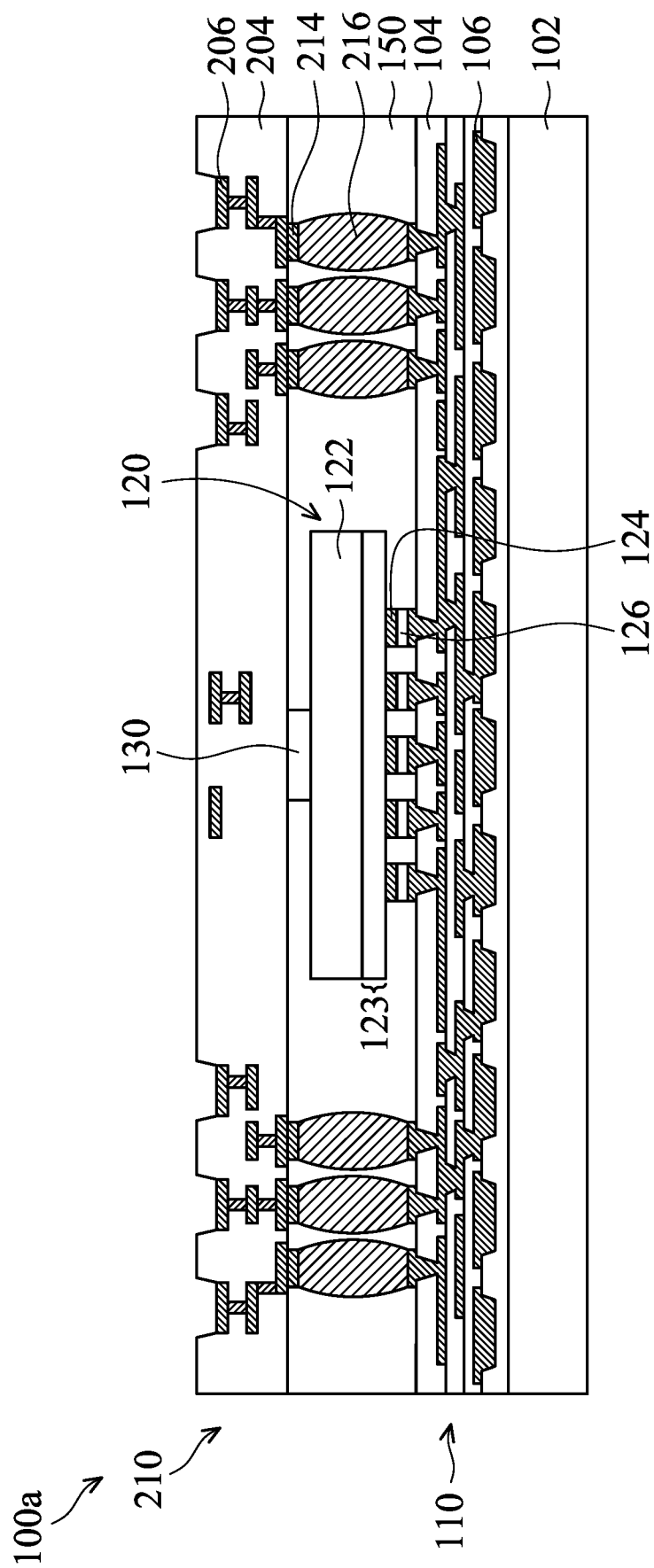
Figure 1G:
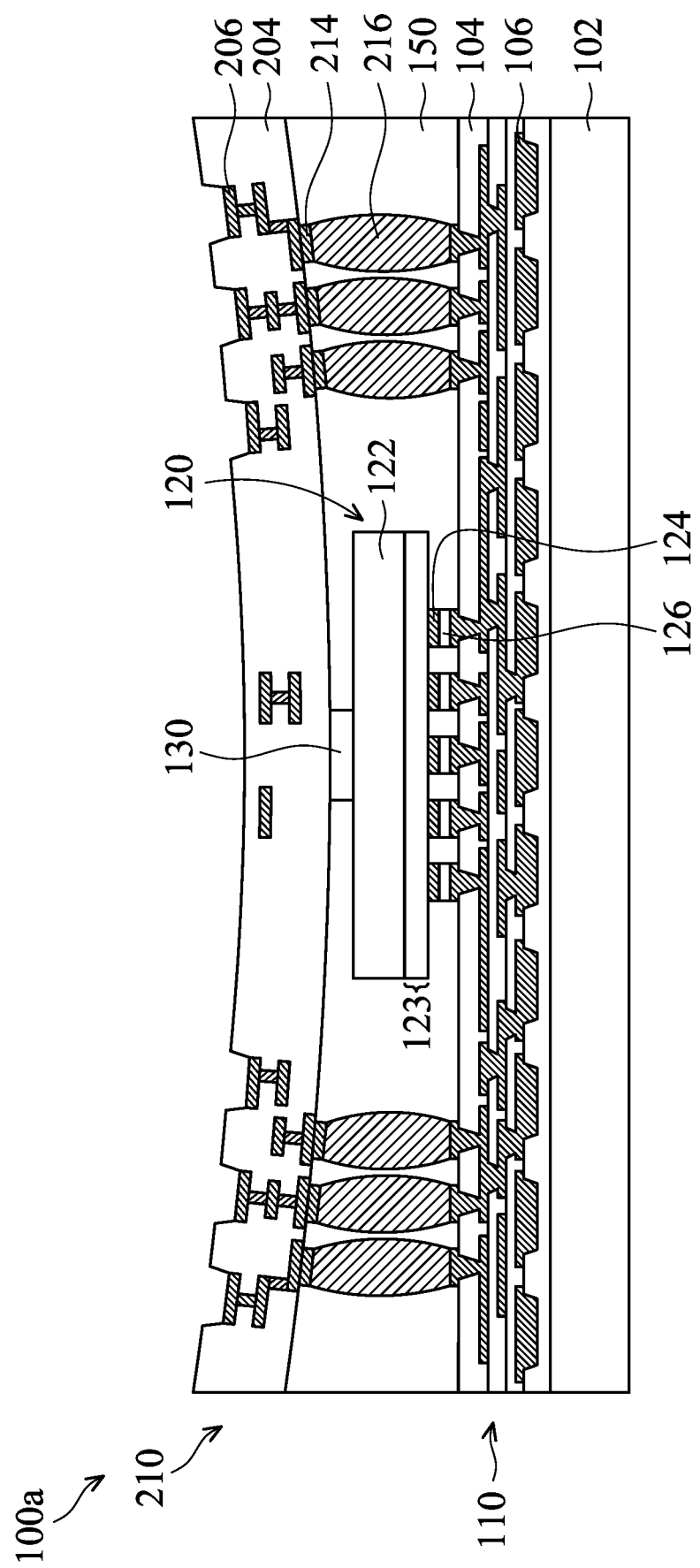

Afterwards, as shown in FIG. 1G, the molding compound material 148 continues to flow from the first side of the first die structure 120 to the second side of the first die structure 120 to form a first package structure 100a, in accordance with some embodiments of the disclosure. As a result, a package layer 150 is formed in the gap 145 and the space 147. The interface (boundary or junction) is between the package layer 150 and the dam structure 130 since the molding compound material 148 is different from the material of the dam structure 130.

The package layer 150 is formed on the second region 12 of the first die structure 120 to surround and protect the first die structure 120. In some embodiments, the package layer 150 is in direct contact with a portion of the first die structure 120 and a portion of the dam structure 130. More specifically, all of the sidewall surfaces of the dam structure 130 are in direct contact with the package layer 150. The second interconnect structure 210 is separated from the first die structure 120 by the package layer 150. The conductive connectors 216 are embedded in the package layer 150.

It should be noted that the warpage of the second interconnect structure 210 may occur when the second interconnect structure 210 is thin (e.g. third height $H_3$ is in a range from about 40 μm to about 150 μm). If the second interconnect structure 210 is warped or bent toward to the second surface 120b of the first die structure 120, the gap 145 between the second surface 120b of the first die structure 120 and the second interconnect structure 210 may not be filled with the liquid molding compound material. Therefore, unwanted voids may form in the gap 145 or the space 147 and the reliability of the package structure is decreased. In order to resolve the issue of void formation, a dam structure 130 is formed to physically support the second interconnect structure 210, and therefore the liquid molding compound material 148 flows smoothly and easily.

FIG. 1G' shows a cross-sectional representation of the first package structure 100a, in accordance with some embodiments of the disclosure. The second interconnect structure 210 is slightly warped, and the dam structure 130 is configured to support the warped second interconnect structure. In some embodiments, the second interconnect structure 210 is bent upwardly and toward to the dam structure. In some other embodiments, the second interconnect structure 210 is bent downwardly and toward far away from the dam structure 130.

Figure 1H:
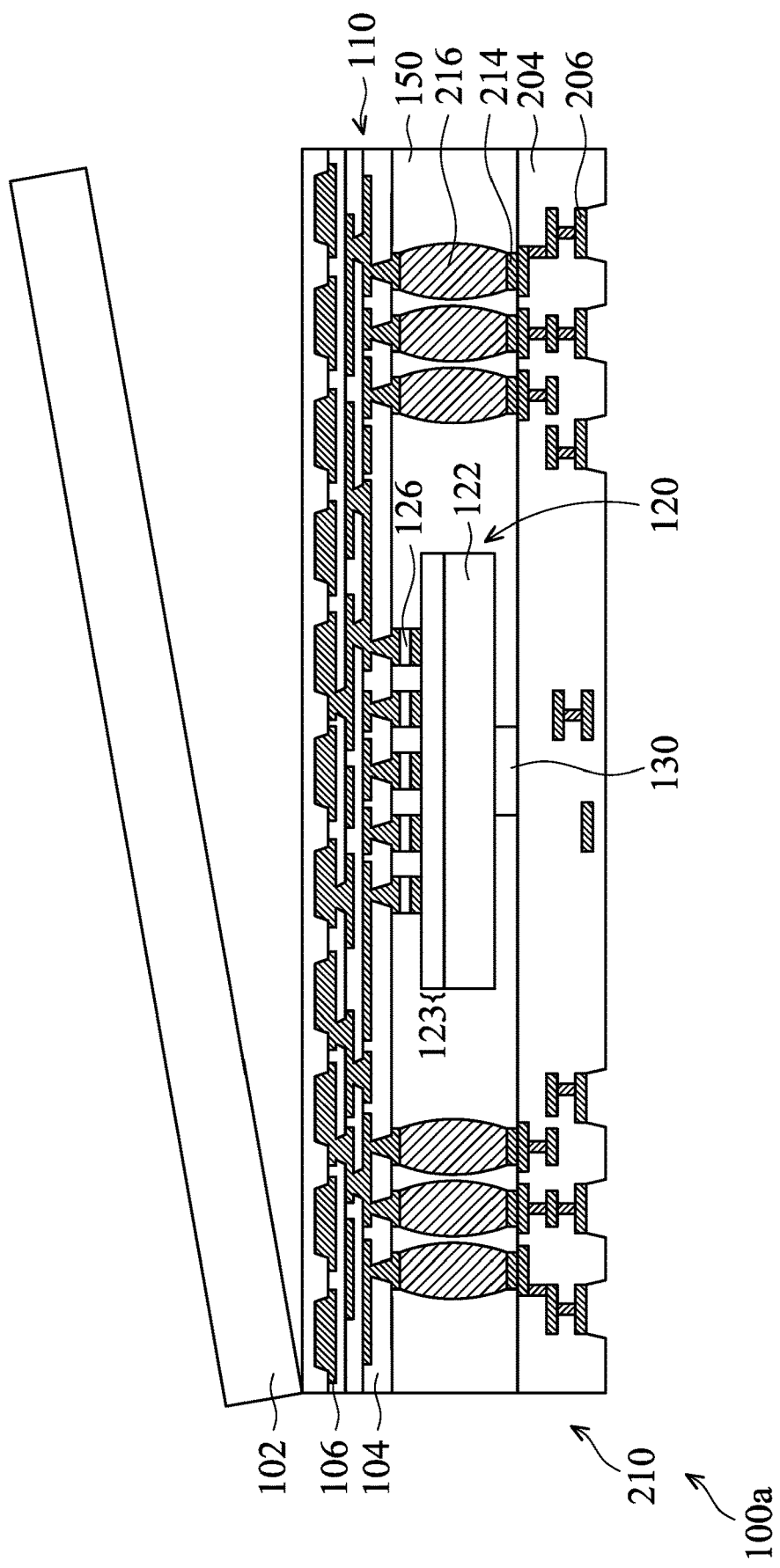
Figure 1I:
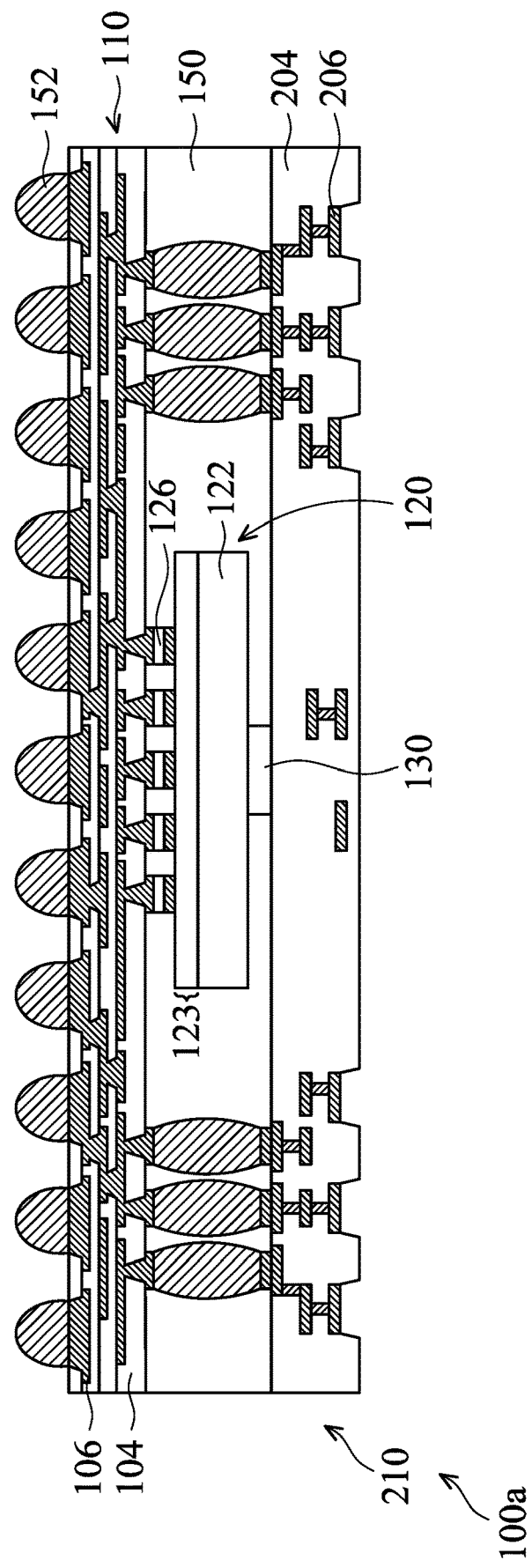

Afterwards, as shown in FIG. 1I, the first die structure 120 is turned upside down and the carrier substrate 102 is removed, in accordance with some embodiments of the disclosure.

Next, as shown in FIG. 1I, a portion of the first interconnect structure 110 is removed, in accordance with some embodiments of the disclosure. As a result, the conductive layer 106 of the first interconnect structure 110 is exposed.

Afterwards, a number of the conductive connectors 152 are formed over the exposed conductive layer 106 of the first interconnect structure 110. The conductive connectors 152 are electrically connected to the conductive layer 106 of the first interconnect structure 110. In some embodiments, the conductive connectors 152 are referred to as controlled collapse chip connection (C4) bumps. In some other embodiments, the conductive connectors 152 is ball grid array (BGA) bumps, electroless nickel-electroless palladium-immersion gold technique (ENEPIG) formed bumps, or the like.

It should be noted that the conductive connectors 152 are formed on the top surface of the first interconnect structure 110, and the conductive connectors 126 are formed on the bottom surface of the first interconnect structure 110. There is a first gap between two adjacent conductive connectors 126, and a second gap between two adjacent conductive connectors 152. The second gap is greater than the first gap. Accordingly, the first interconnect structure 110 enables the fan-out connection.

Figure 1J:
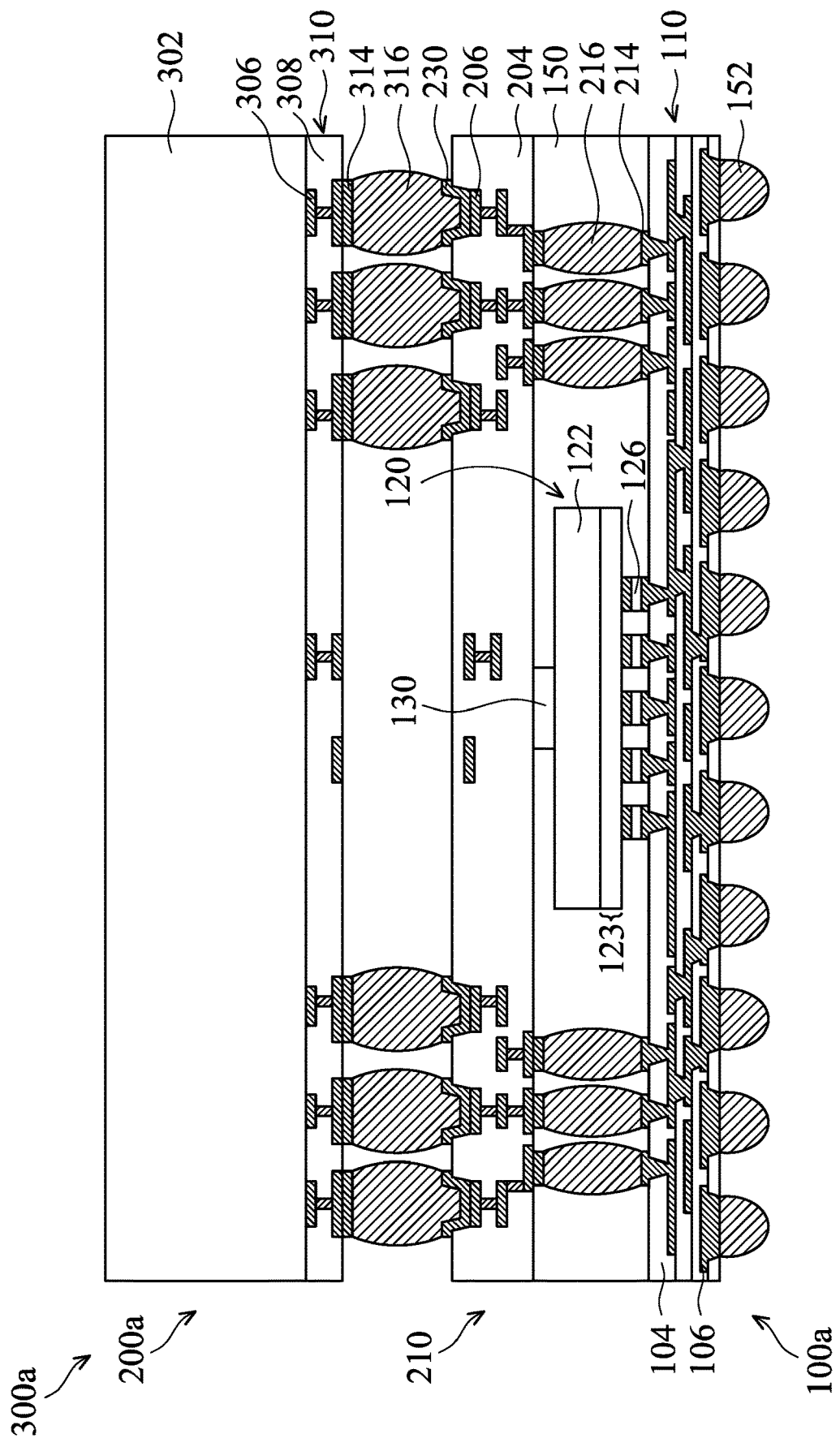

Next, as shown in FIG. 1J, the first package structure 100a is turned upside down and a second package structure 200a is formed over the second interconnect structure 210, in accordance with some embodiments of the disclosure. As a result, a package structure 300a including the first package structure 100a and the second package structure 200a is obtained. The dam structure 130 is between the first die structure 120 and a second die structure 302.

An under bump metallization (UBM) layer 230 is formed over the conductive layer 206 of the second interconnect structure 210. The second package structure 200a includes the second die structure 302 and a third interconnect structure 310 below the second die structure 302. The third interconnect structure 310 includes multiple dielectric layers 308 and multiple conductive layers 306 formed in the dielectric layers 308.

A conductive pad 314 is formed below the third interconnect structure 310, and a conductive connector 316 is formed on the conductive pad 314. The second package structure 200a is boned to the first package structure 100a by the conductive connector 316. The conductive connector 316 is between the conductive pad 314 and the UBM layer 230.

In some embodiments, the second die structure 302 includes a static random access memory (SRAM) device, a dynamic random access memory (DRAM) device, a high bandwidth memory (HBM) device or another memory device.

As mentioned above, the dam structure 130 is formed to physically support the second interconnect structure 210, and therefore the liquid molding compound material 148 can easily fill into the gap 145 between the first die structure 120 and the second interconnect structure 210. The formation of the dam structure can prevent voids from forming.

FIGS. 2A-2D shows top-view representations of the first package structure 100a, in accordance with some embodiments of the disclosure. FIG. 1E show cross-sectional representation taken along line A-A' of FIGS. 2A-2D.

As shown in FIGS. 2A-2D, a dam structure 130 is located on a central area of the second surface 120b of the first die structure 120. The first die structure 120 has a rectangular shape when seen from a top-view.

The dam structure 130 has a rectangular (FIG. 2A), a circular (FIG. 2B), an oval (FIG. 2C), a cross (FIG. 2D), or a polygonal shape when seen from a top-view. The dam structure 130 is mainly formed on the central area of the second surface 120b of the first die structure 120 to support the second interconnect structure 210 uniformly.

FIGS. 3A-3D show cross-sectional representations of various stages of forming a package structure 100b, in accordance with some embodiments of the disclosure. The package structure 100b is similar to, or the same as, the first package structure 100a shown in FIG. 1I, except that a protection layer 220 is formed on the second interconnect structure 210. Processes and materials used to form the package structure 100b may be similar to, or the same as, those used to form the first package structure 100a and are not repeated herein.

Figure 3A:
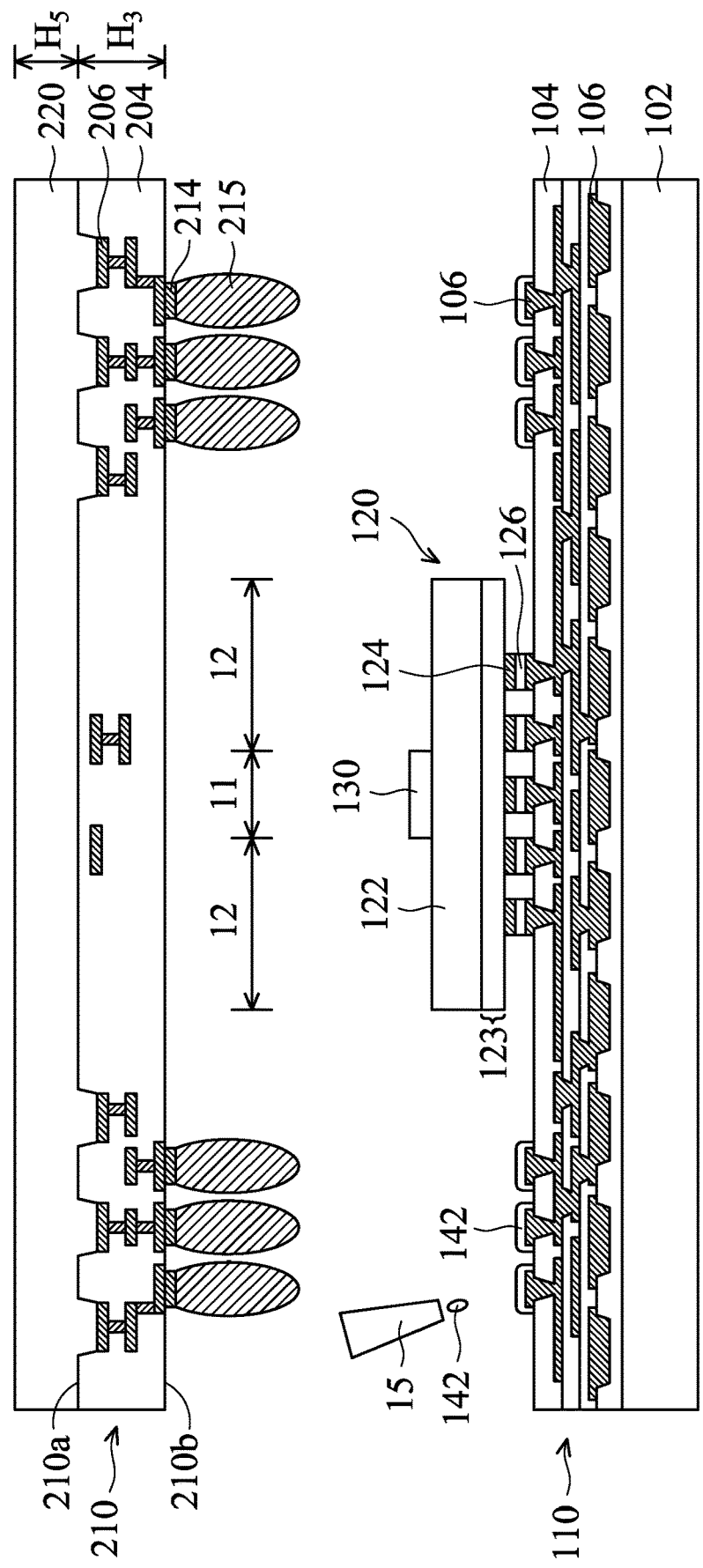
FIGS. 3A-3D show cross-sectional representations of various stages of forming a package structure, in accordance with some embodiments of the disclosure.

As shown in FIG. 3A, a protection layer 220 is formed over the second interconnect structure 210. The second interconnect structure 210 includes a first surface 210a and a second surface 210b. The protection layer 220 is formed on the first surface 210a of the second interconnect structure 210, and the conductive pad 214 is formed on the second surface 210b of the second interconnect structure 210. The protection layer 220 is configured to temporarily protect the conductive layers 206 of the second interconnect structure 210 from being damage during the process for forming the package layer 150.

The protection layer 220 is made of polymer, such as polyethylene (PE), polyethylene terephthalate (PET), polymethyl methacrylate (PMMA), or other applicable materials. The protection layer 220 has a fifth height $H_5$ in the vertical direction. The second interconnect structure 210 has a third height $H_3$ in the vertical direction. In some embodiments, the fifth height $H_5$ is greater than one half of the third height $H_3$. The fifth height $H_5$ should be greater than one half of the third height $H_3$ to effectively protect the underlying second interconnect structure 210. In some embodiments, the fifth height $H_5$ should be greater than 10 μm to effectively protect the underlying second interconnect structure 210. In some embodiments, the fifth height $H_5$ should be smaller than half of the second interconnect structure 210.

Figure 3B:
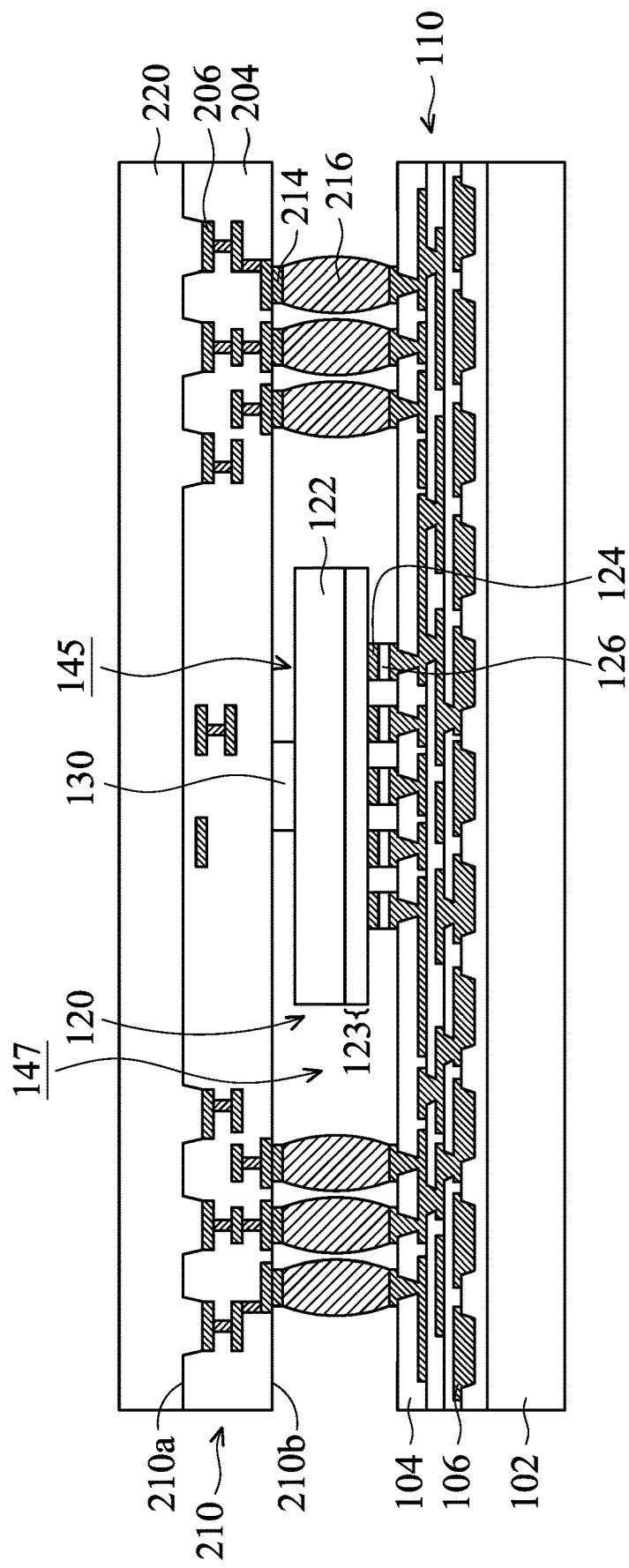

Next, as shown in FIG. 3B, the second interconnect structure 210 is bonded to the first interconnect structure 110 through the conductive connector 216, in accordance with some embodiments of the disclosure.

Figure 3C:
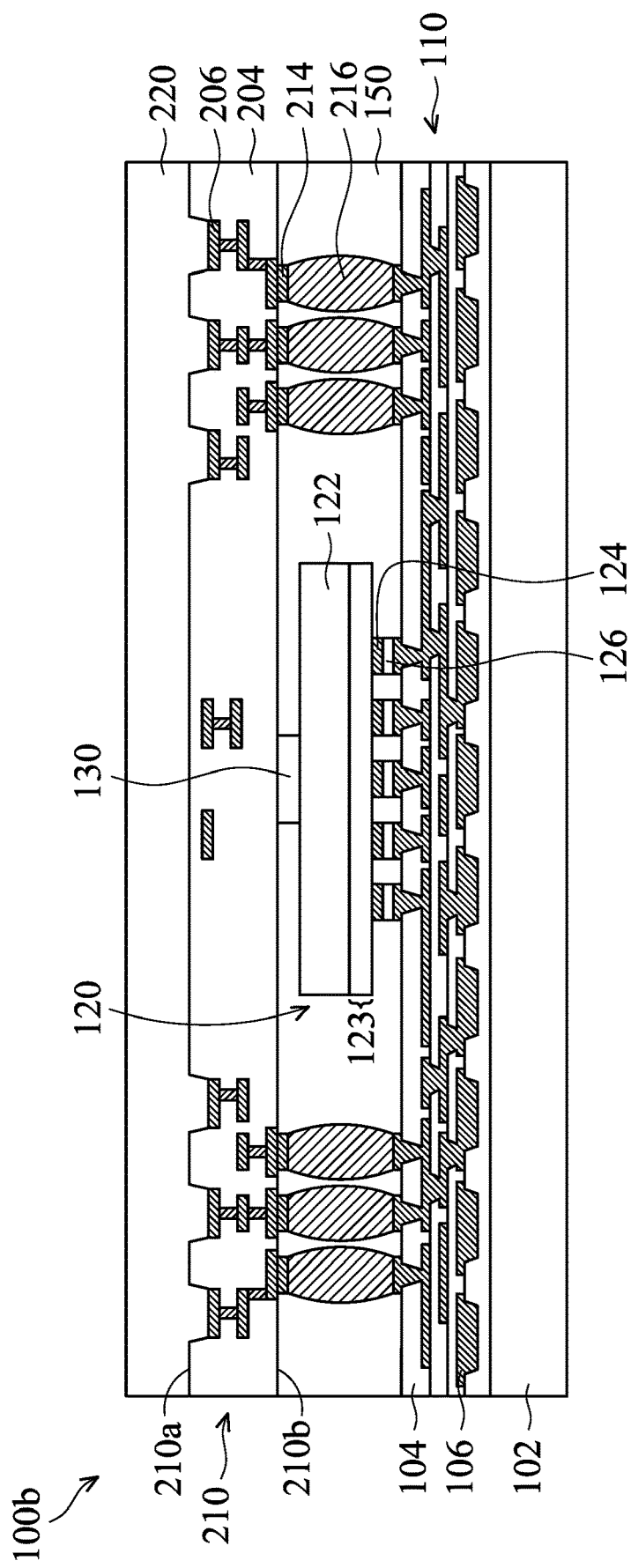

Subsequently, as shown in FIG. 3C, the package layer 150 is formed in the gap 145 and in the space 147 (the gap 145 and the space 147 are shown in FIG. 3B). Since the top surface of the second interconnect structure 210 is covered by the protection layer 220, the conductive layer 206 is not exposed during forming the package layer 150. Therefore, the conductive layer 206 is not polluted by the package layer 150 to further improve the reliability of the package structure 100b.

Figure 3D:
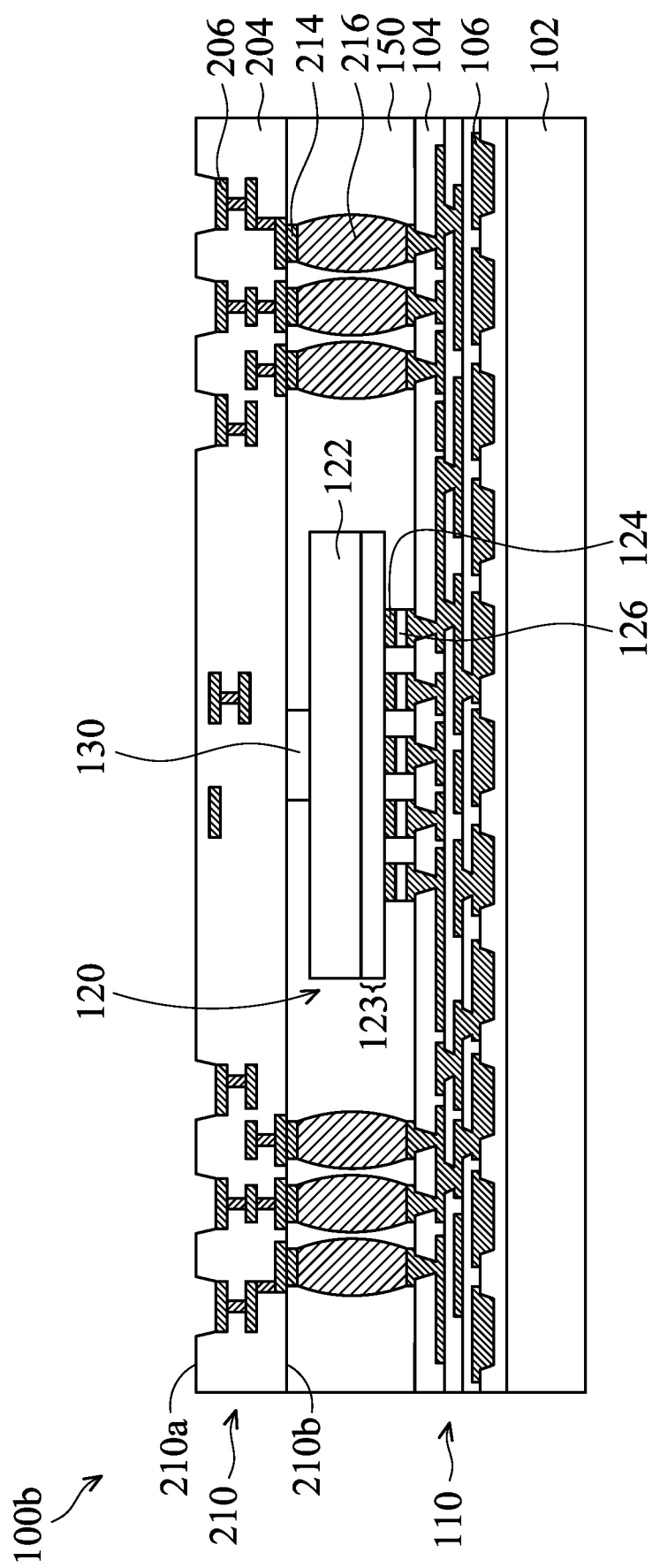

Afterwards, as shown in FIG. 3D, the protection layer 220 is removed, in accordance with some embodiments of the disclosure. In some embodiments, the protection layer 220 is removed by an mechanical peeling method or a wet etching process.

Next, the structure of FIG. 3D continues to proceed the steps of FIGS. 1H-1J.

Figure 4A:
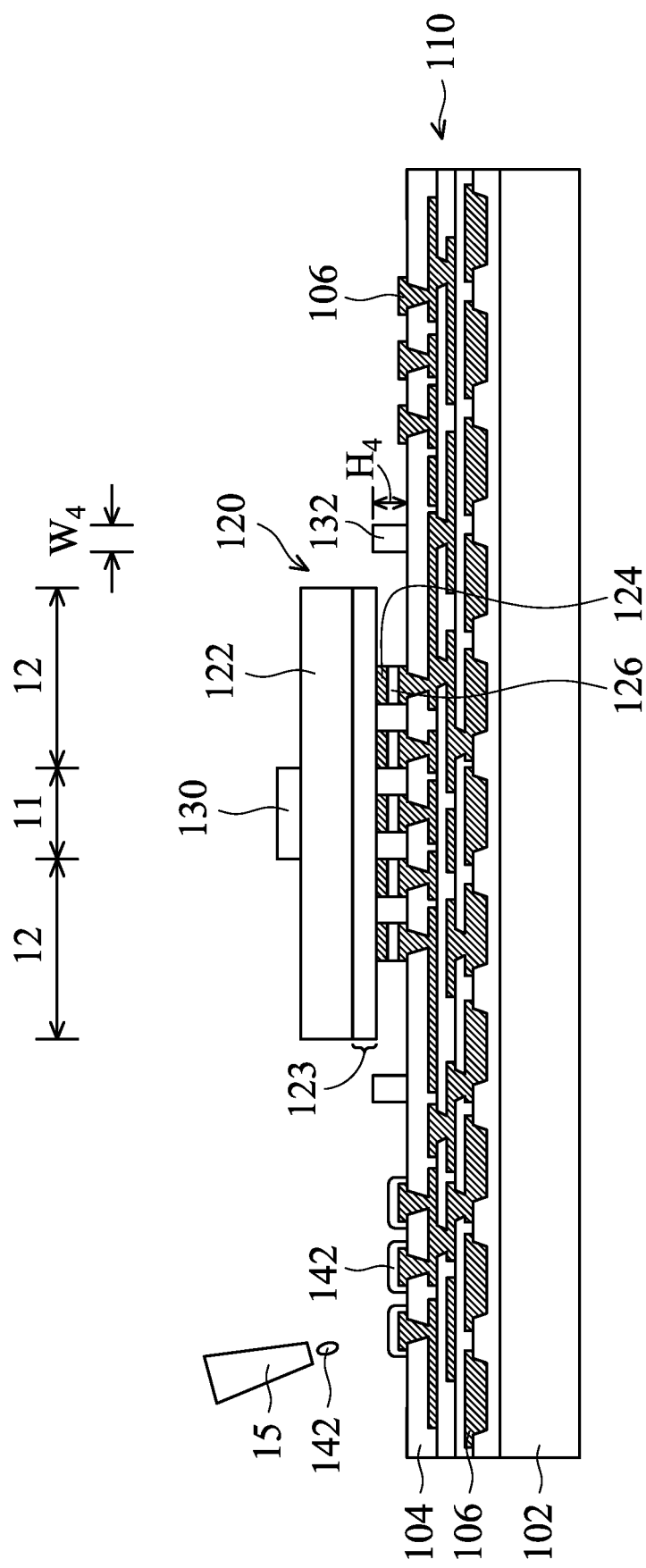
FIGS. 4A-4C show cross-sectional representations of various stages of forming a package structure, in accordance with some embodiments of the disclosure.
Figure 4B:
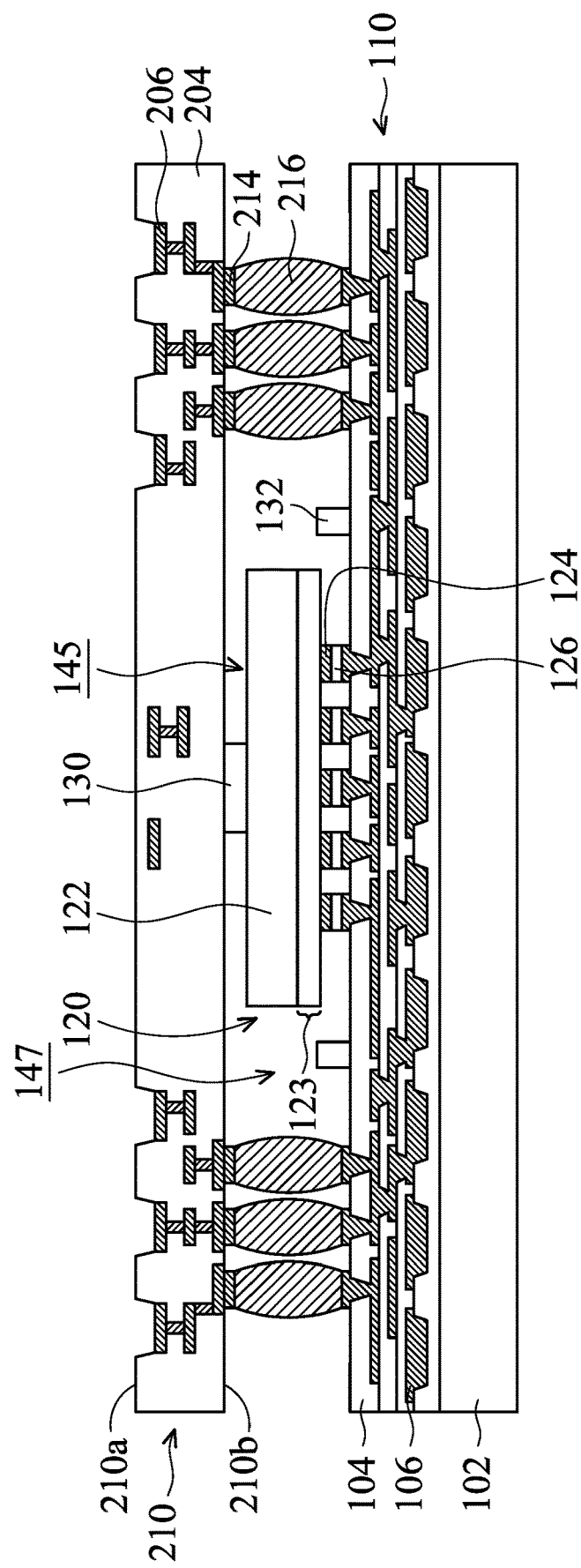
Figure 4C:
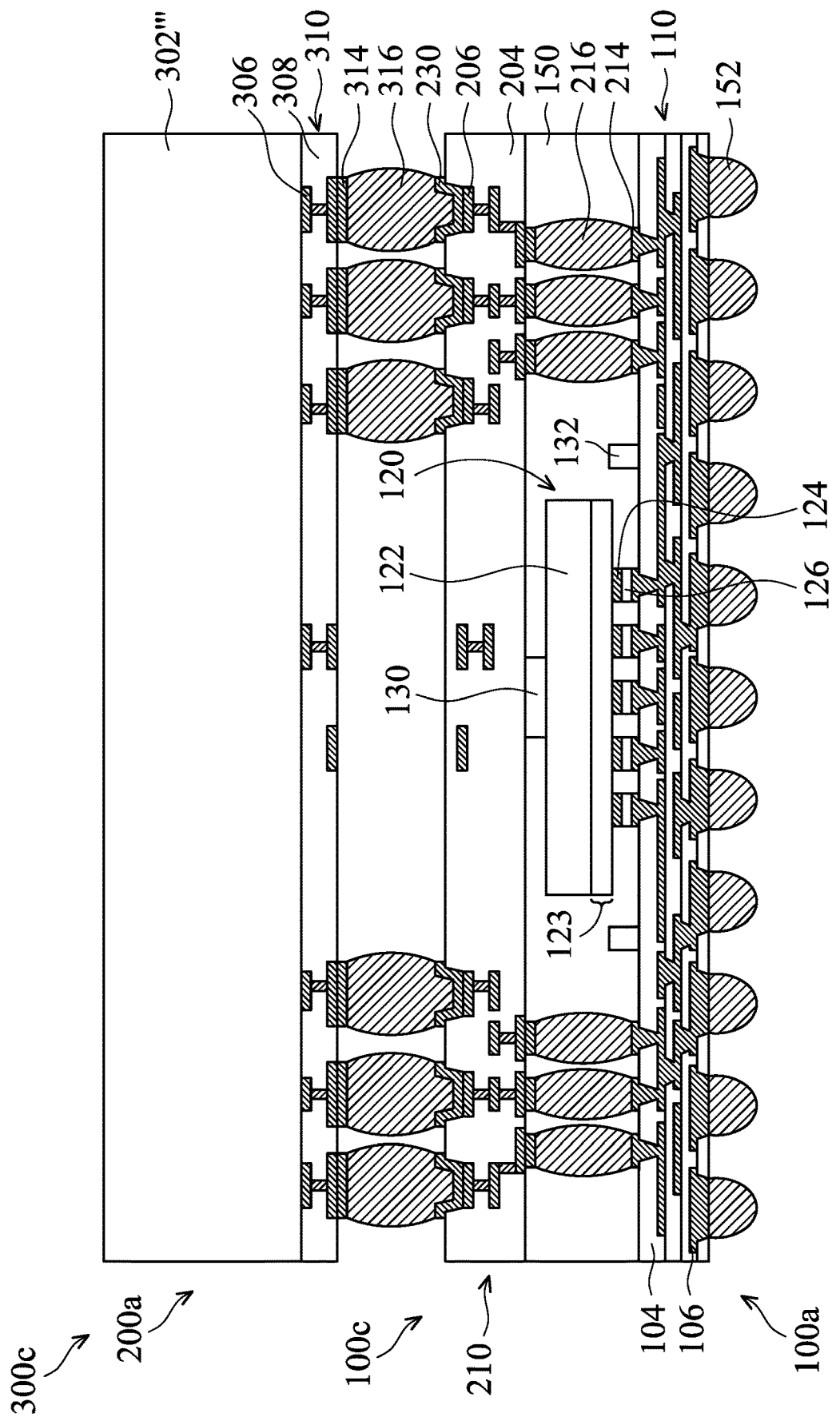

FIGS. 4A-4C show cross-sectional representations of various stages of forming a package structure 300c, in accordance with some embodiments of the disclosure. The package structure 300c is similar to, or the same as, the package structure 300a shown in FIG. 1J, except that a ring structure 132 surrounds the first die structure 120. Processes and materials used to form the package structure 300c may be similar to, or the same as, those used to form the package structure 300a and are not repeated herein.

As shown in FIG. 4A, a ring structure 132 is formed to surround the first die structure 120, and the dam structure 130 is formed over the second surface 120b of the first die structure 120. The first die structure 120 is surrounded by the ring structure 132. In other words, the ring structure 132 is between the dam structure 130 and the conductive connectors 216. Afterwards, the flux 142 is formed on the conductive layer 106.

It should be noted that the ring structure 132 is configured to block the flowing of the flux (formed later). If the flux 142 flows into the area below the first die structure 120, two adjacent conductive connector 126 may migrate together to induce unwanted bridging problem. In order to prevent the bridging problem, the ring structure 132 continuously encircles the first die structure 120. In some embodiments, the top surface of the ring structure 132 is higher than the top surface of the conductive pad 124.

In some embodiments, the material of the ring structure 132 is the same as the material of the dam structure 130. In some embodiments, the ring structure 132 is formed by a printing process or a dispensing process. In some other embodiments, the ring structure 132 is formed at another location to have fixed shape, and then is adhered to the dielectric layer 104 of the first interconnect structure 110. In some embodiments, the dam structure 130 and the ring structure 132 are formed simultaneously. In some other embodiments, the dam structure 130 is formed firstly, and then the ring structure is formed.

The ring structure 132 has a fourth width $W_4$ in a horizontal direction, and a fourth height $H_4$ in a vertical direction. In some embodiments, the fourth width $W_4$ is in a range from about 10 µm to about 50 µm. In some embodiments, the fourth height $H_4$ is in a range from about 10 µm to about 50 µm. When the fourth width $W_4$ and the fourth height $H_4$ of the ring structure 132 is within above-mentioned range, the ring structure 132 can effectively block the flowing of the flux and further prevent the bridging problem.

Next, as shown in FIG. 4B, the second interconnect structure 210 is formed over the first die structure 120 by using the conductive connectors 216.

Subsequently, as shown in FIG. 4C, the package layer 150 is formed in the space between the first interconnect structure 110 and the second interconnect structure 210 to form a first package structure 100c. In addition, the package layer 150 is formed in the gap between the first die structure 120 and the second interconnect structure 210. The second package structure 200a is formed on the first package structure 100c. The package structure 300c including the first package structure 100c and the second package structure 200a is obtained.

FIGS. 5A-5D show top-view representations of the package structure 100c, in accordance with some embodiments of the disclosure. FIG. 4B show cross-sectional representation taken along line B-B' of FIGS. 5A-5D.

Figure 5B:
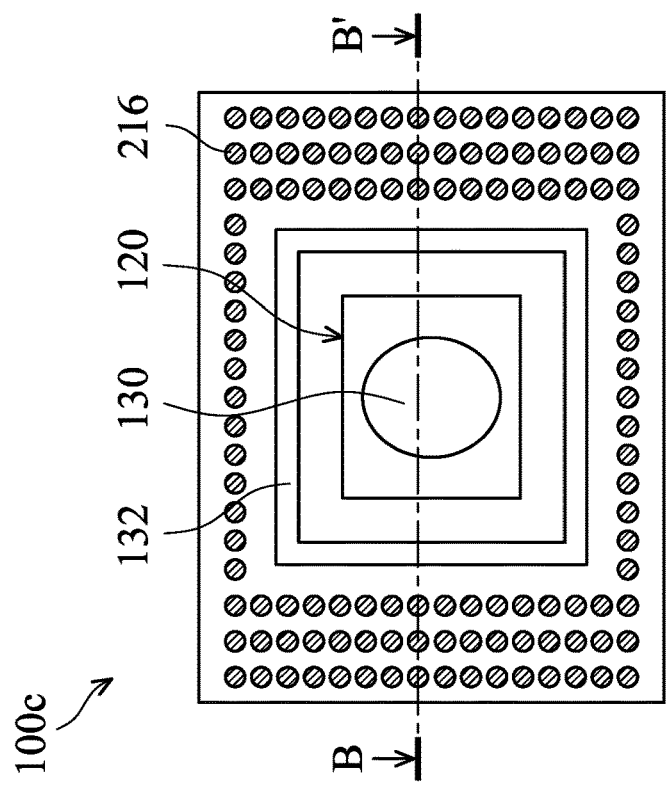
FIGS. 5A-5D show top-view representations of package structures, in accordance with some embodiments of the disclosure.
Figure 5A:
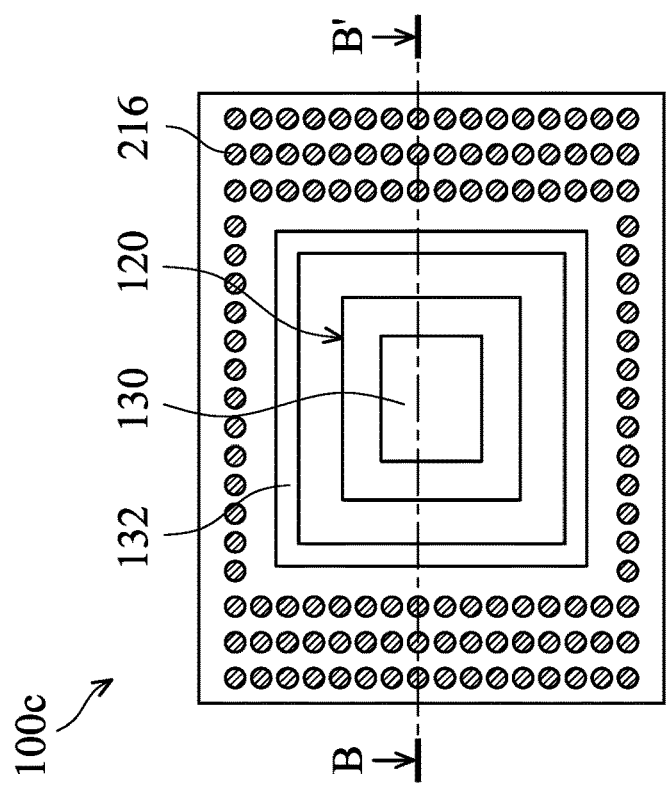

As shown in FIG. 5A, the ring structure 132 has a rectangular shape when seen from a top-view. The dam structure 130 also has a rectangular shape when seen from a top-view. As shown in FIG. 5B, the ring structure 132 has a rectangular shape when seen from a top-view. The dam structure 130 also has a circular shape when seen from a top-view.

Figure 5D:
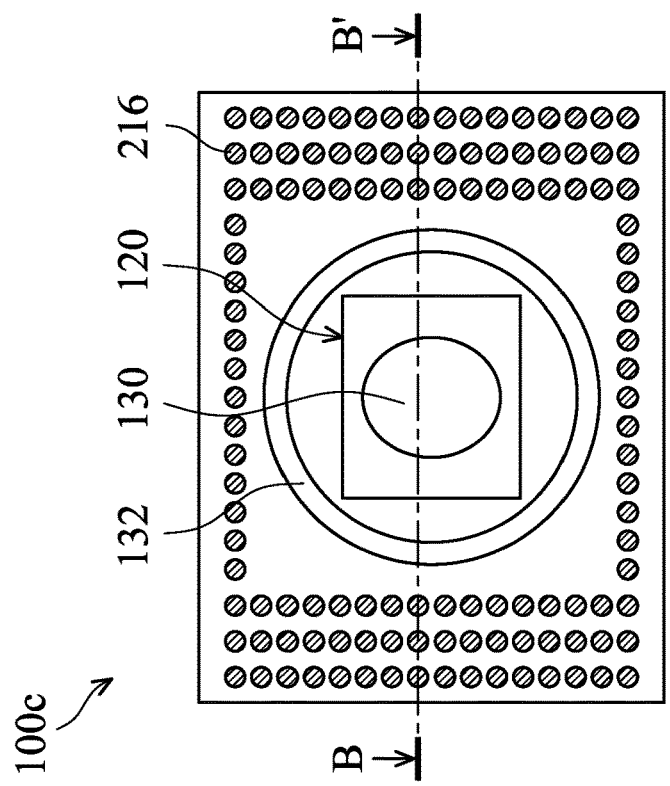
Figure 5C:
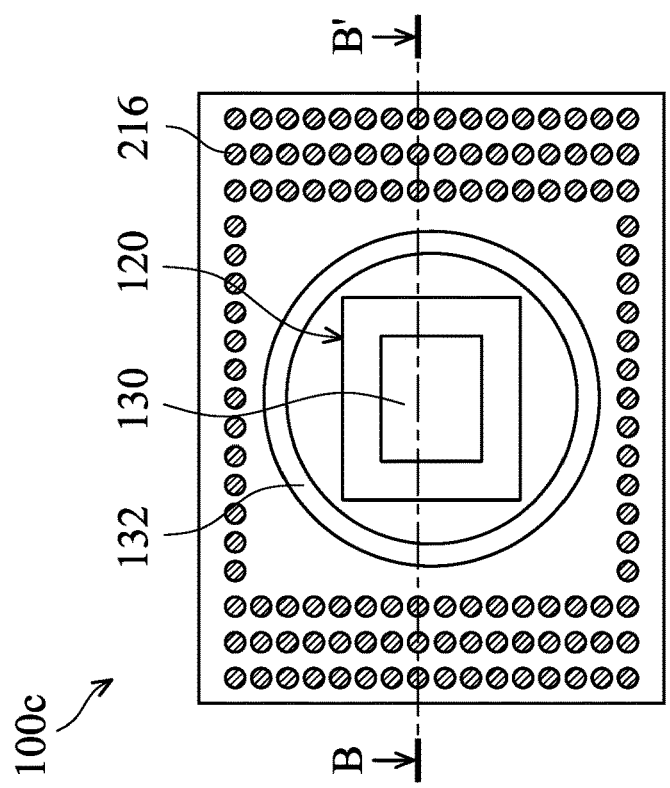

As shown in FIG. 5C, the ring structure 132 has a circular shape when seen from a top-view. The dam structure 130 has a rectangular shape when seen from a top-view. As shown in FIG. 5D, the ring structure 132 has a circular shape when seen from a top-view. The dam structure 130 also has a circular shape when seen from a top-view.

Figures 2A, 2B:
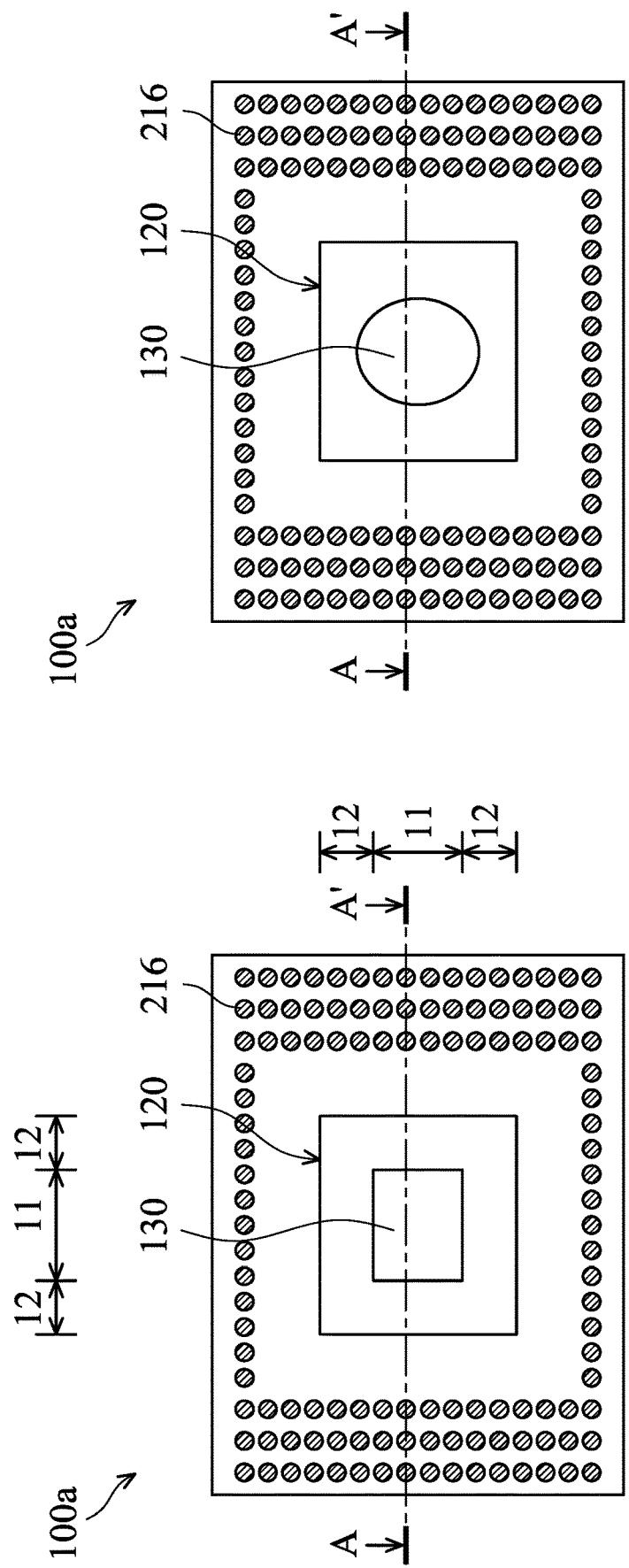
FIGS. 2A-2D shows top-view representations of package structures, in accordance with some embodiments of the disclosure.
Figure 2D:
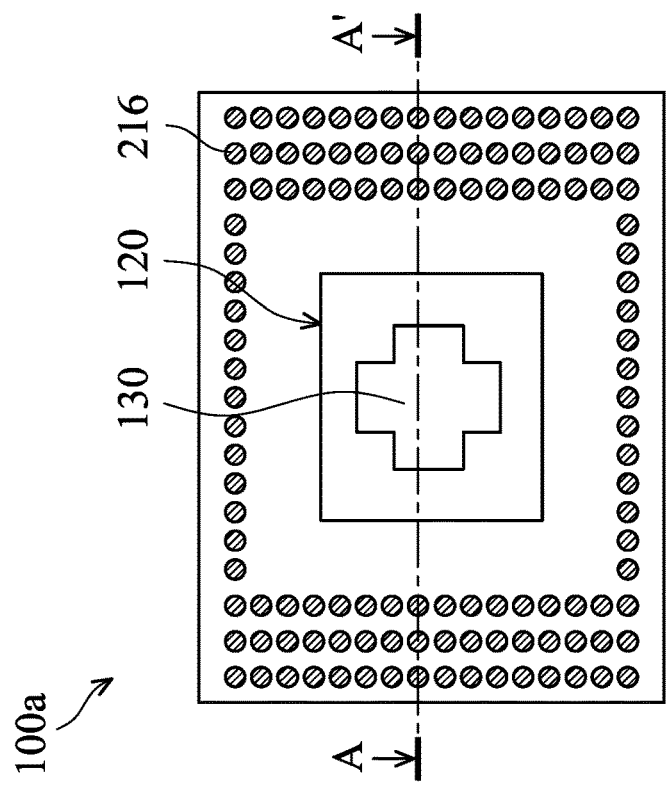
Figure 2C:
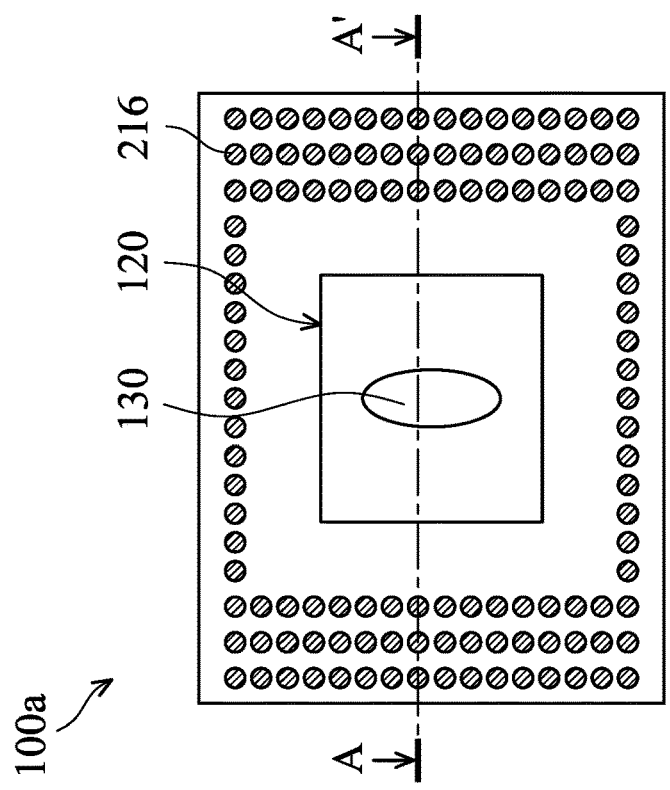
Figure 6A:
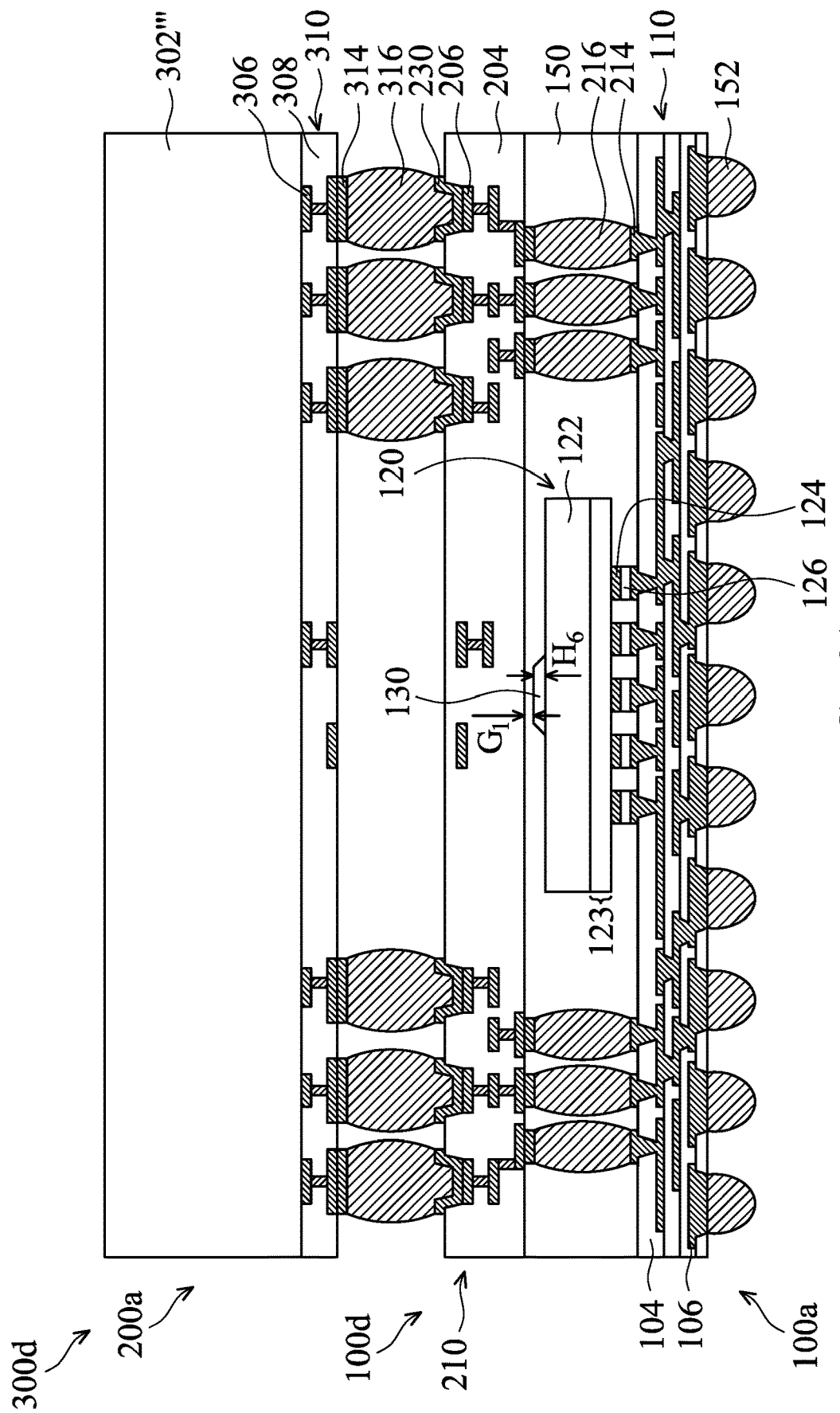
FIG. 6A shows a cross-sectional representation of a package structure, in accordance with some embodiments of the disclosure.

FIG. 6A shows a cross-sectional representation of a package structure 300d, in accordance with some embodiments of the disclosure. The package structure 300d is similar to, or the same as, the package structure 300a shown in FIG. 11, except that the dam structure 130 has a trapezoidal shape with a top width and a bottom width, and the bottom width is greater than the top width. The package structure 300d includes a first package structure 100d and the second package structure 200a. FIG. 2A shows a top view representation of FIG. 6A.

As shown in FIG. 6A, in addition to the all of the sidewall surfaces of the dam structure 130 is covered by the package layer 150, the top surface of the dam structure 130 is covered by the package layer 150. In other words, the top surface of the dam structure 130 is in direct contact with the package layer 150. The dam structure 130 has a trapezoid shape, and the bottom width is in direct contact with the first die structure 120.

In some embodiments, the conductive connector 216 is higher than the top surface of the dam structure 130. The dam structure 130 has a sixth height $H_6$ in a vertical direction. In some embodiments, the sixth height $H_6$ is in a range from about 10 µm to about 40 µm. The gap height $G_1$ between the bottom surface of the second interconnect structure 210 and the top surface of the dam structure 130. In some embodiments, the gap height $G_1$ is in a range from about 0.1 µm to about 50 µm.

Figure 6B:
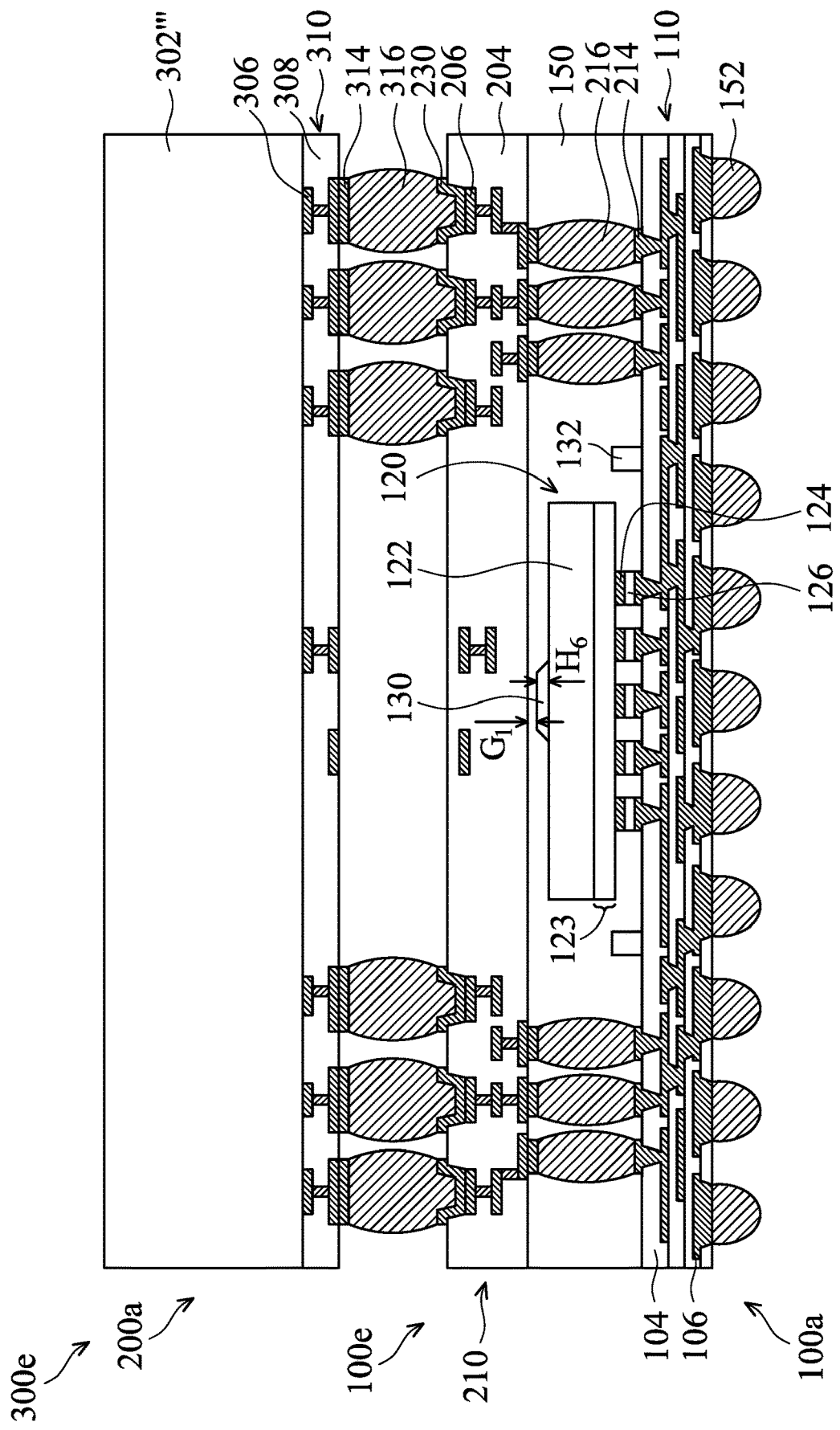
FIG. 6B shows a cross-sectional representation of a package structure, in accordance with some embodiments of the disclosure.

FIG. 6B shows a cross-sectional representation of a package structure 300e, in accordance with some embodiments of the disclosure. The package structure 300e is similar to, or the same as, the package structure 300d shown in FIG. 6A, except that the ring structure 132 surrounds the first die structure 120. The package structure 300e includes a first package structure 100e and the second package structure 200a.

As shown in FIG. 6B, the ring structure 132 surrounds the dam structure 130. In some embodiments, the top surface of the ring structure 132 is higher than the top surface of the conductive pad 124.

Figure 7A:
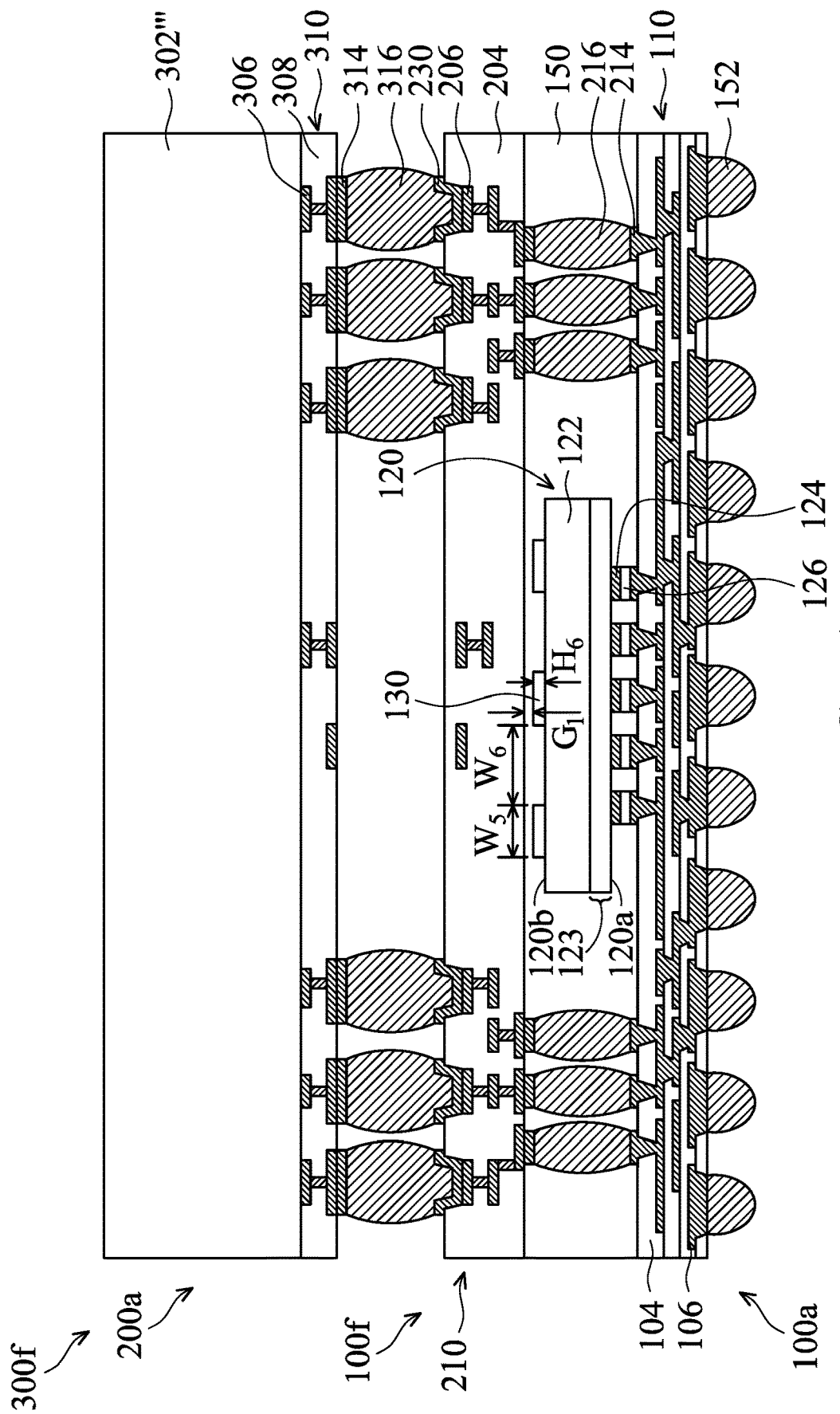
FIG. 7A shows a cross-sectional representation of a package structure, in accordance with some embodiments of the disclosure.

FIG. 7A shows a cross-sectional representation of a package structure 300f, in accordance with some embodiments of the disclosure. The package structure 300f is similar to, or the same as, the package structure 300a shown in FIG. 11, except that the dam structure 130 includes a number of sub-dam portions 131. The package structure 300f includes a first package structure 100f and the second package structure 200a.

As shown in FIG. 7A, the sub-dam portions 131 are formed on the second surface 120b of the first die structure 120. In some embodiments, the top surface of each of the sub-dam portions 131 is not in direct contact with the second interconnect structure 210, but is in direct contact with the package layer 150. The package layer 150 covers the top surface and all of the sidewall surfaces of the sub-dam portions 131. In some other embodiments, the top surface of each of the sub-dam portions 131 is in direct contact with the second interconnect structure 210.

Each of the sub-dam portions 131 has a fifth width $W_5$, and a sixth width $W_6$ is between two adjacent sub-dam portions 131. In some embodiments, the sixth width $W_6$ is greater than the fifth width $W_5$. In some embodiments, the sum of the width of each of the sub-dam portions 131 is less than the width of the first die structure 120. In some embodiments, the fifth width $W_5$ of each of the sub-dam portions 131 is in a range from about 0.05 mm to about 3 mm.

Figure 7B:
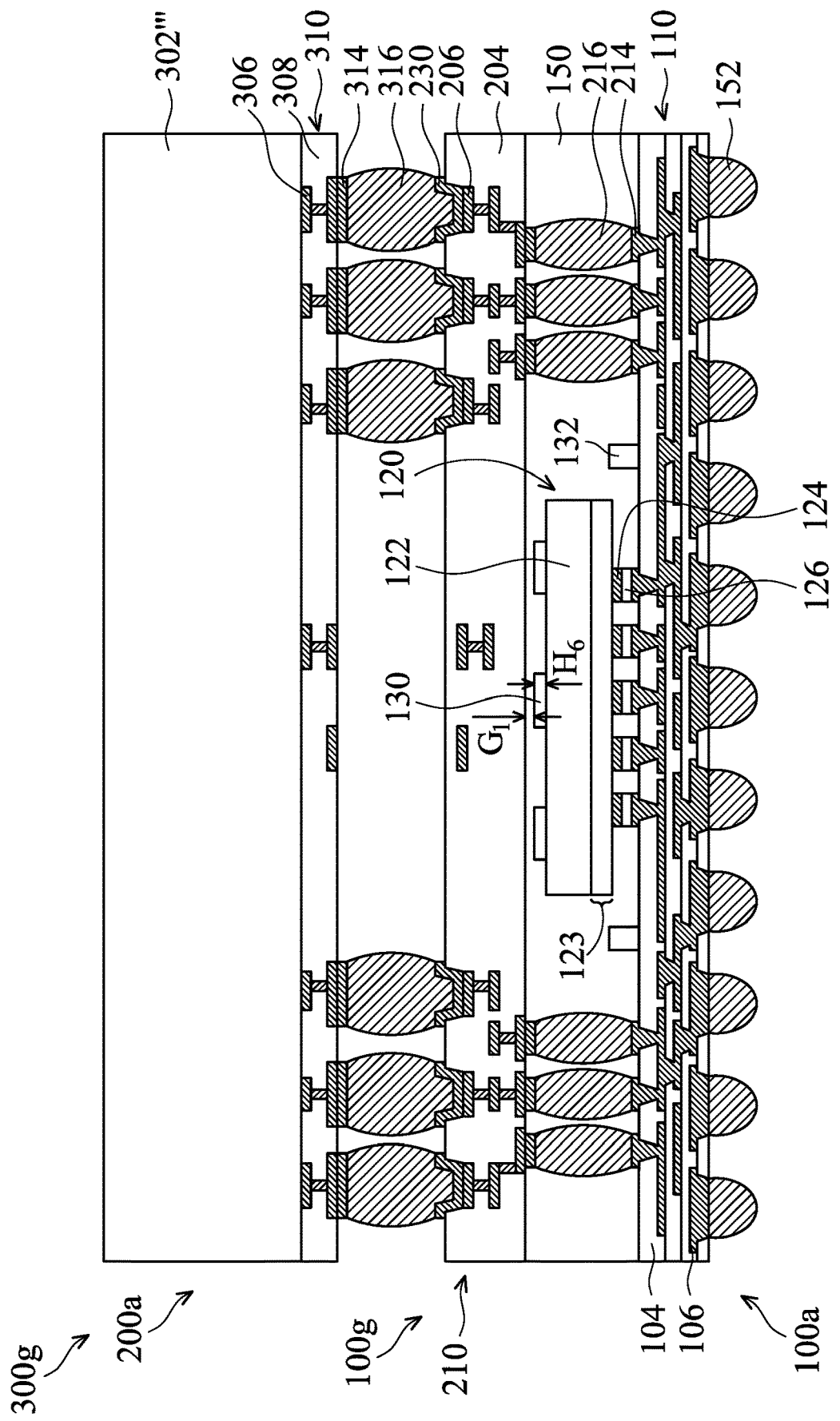
FIG. 7B shows a cross-sectional representation of a package structure, in accordance with some embodiments of the disclosure.

FIG. 7B shows a cross-sectional representation of a package structure 300g, in accordance with some embodiments of the disclosure. The package structure 300g is similar to, or the same as, the package structure 300f shown in FIG. 7A, except that the ring structure 132 surrounds the first die structure 120. The package structure 300g includes a first package structure 100g and the second package structure 200a.

FIGS. 8A-8E show top-view representations of the package structure 100f, in accordance with some embodiments of the disclosure. FIG. 7A show cross-sectional representation taken along line C-C' of FIGS. 8A-8E.

Figure 8B:
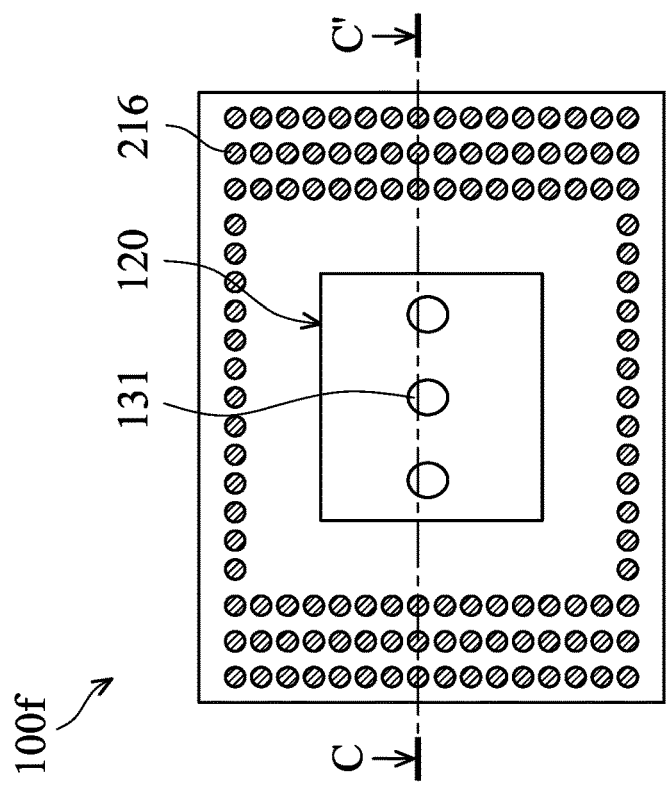
FIGS. 8A-8E show top-view representations of the package structure, in accordance with some embodiments of the disclosure.
Figure 8A:
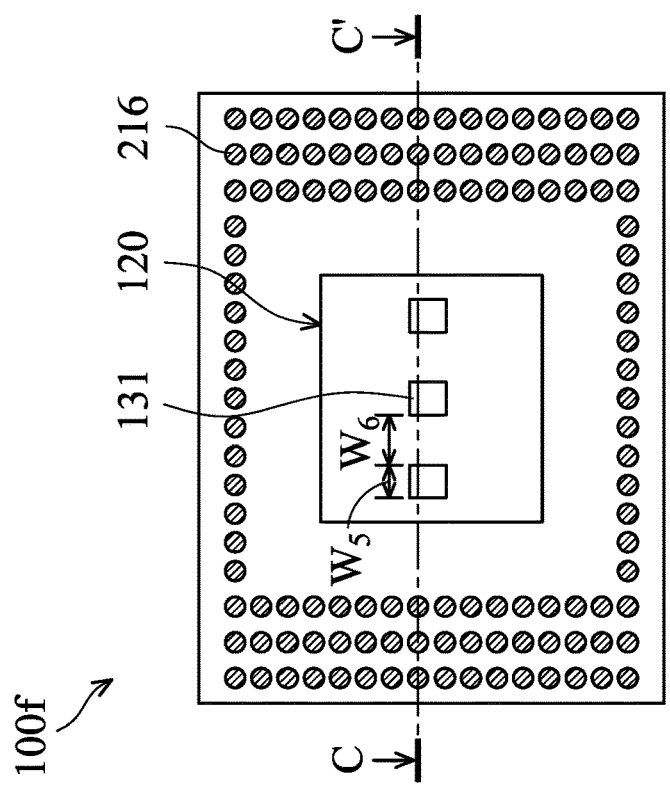
Figure 8D:
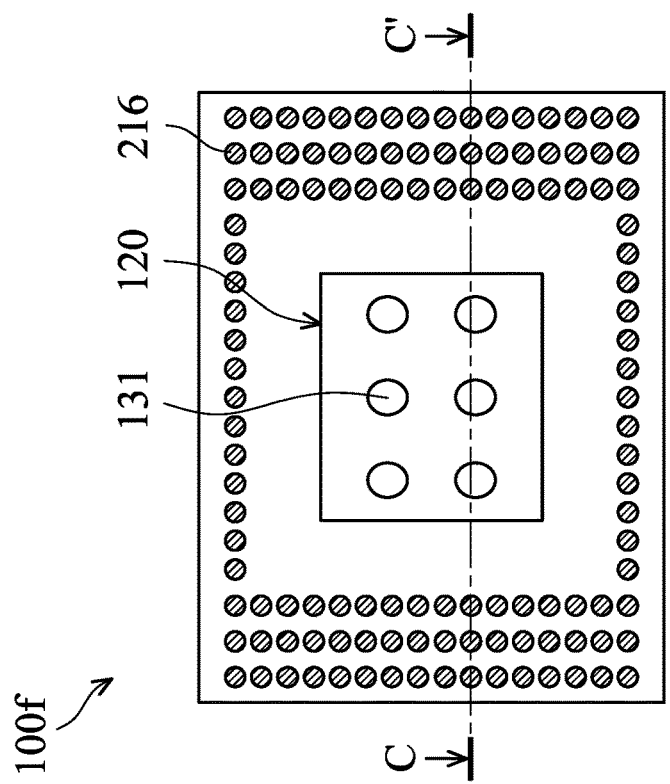
Figure 8C:
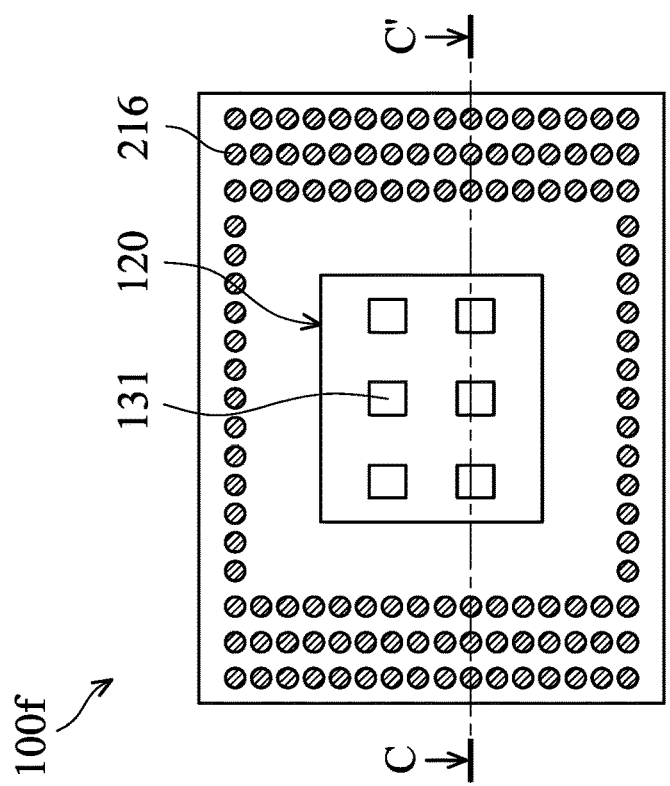
Figure 8E:
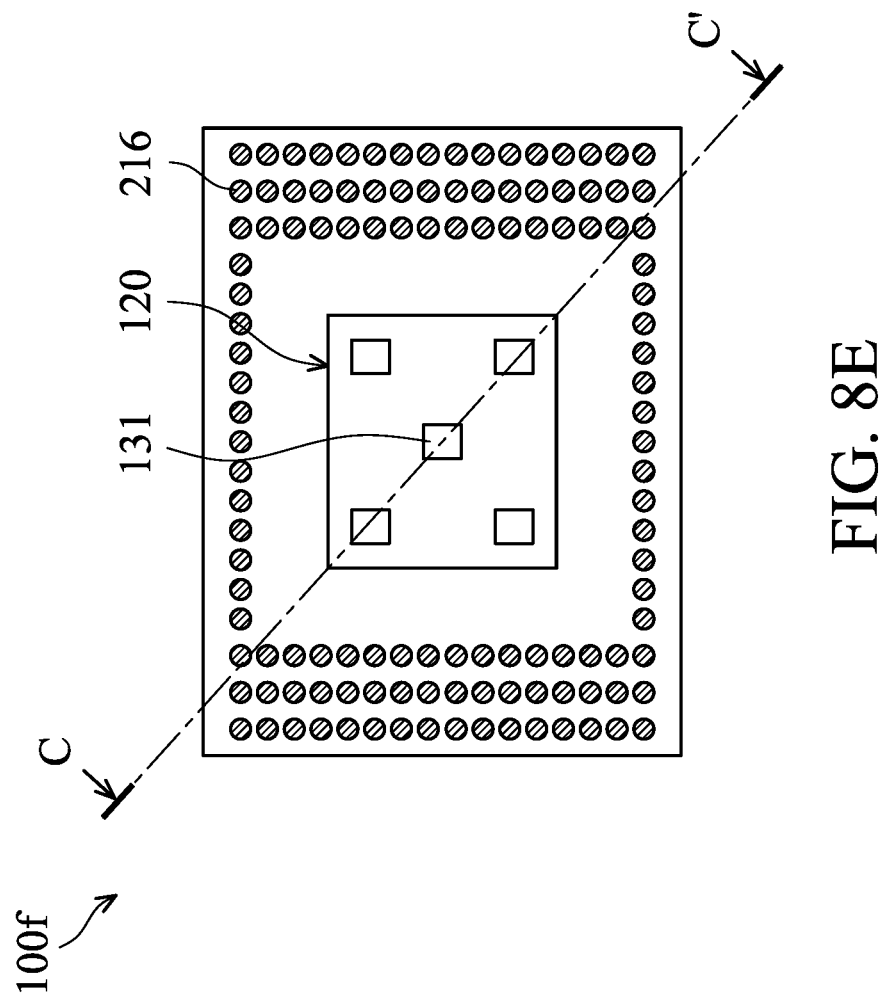
Figure 9B:
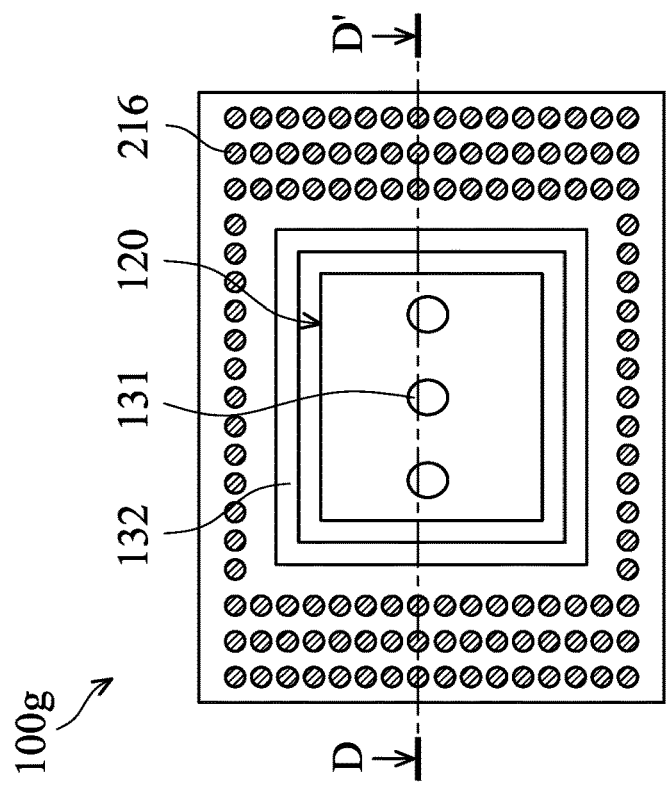
FIGS. 9A-9E show top-view representations of the package structure, in accordance with some embodiments of the disclosure.
Figure 9A:
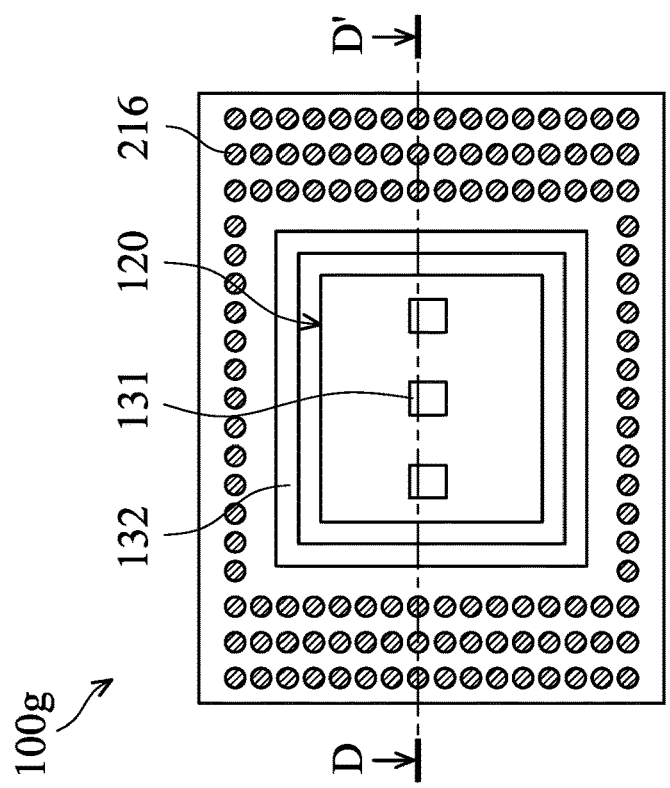
Figure 9D:
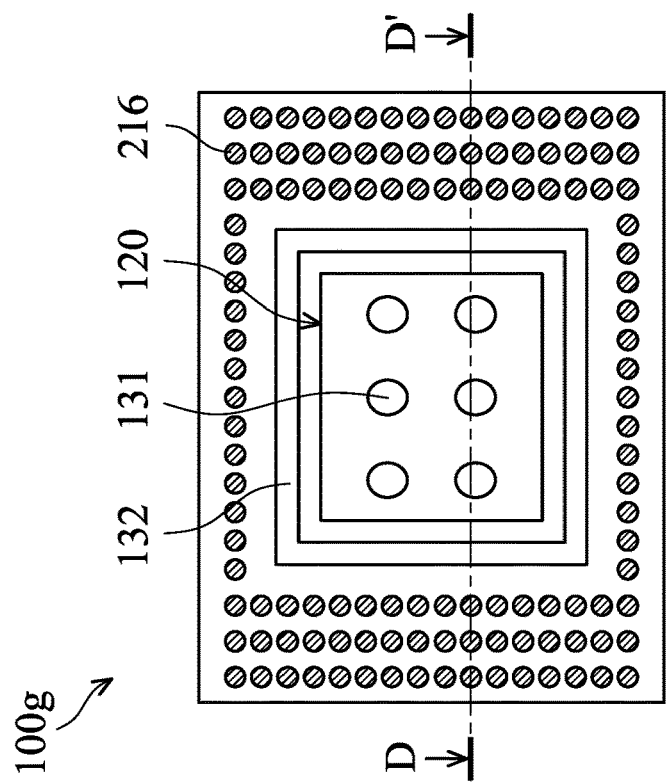
Figure 9C:
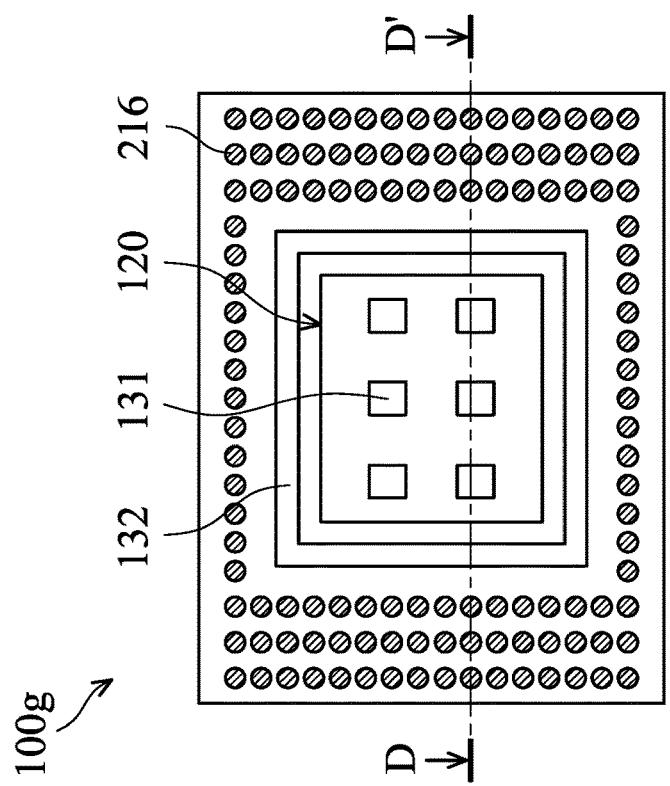
Figure 9E:
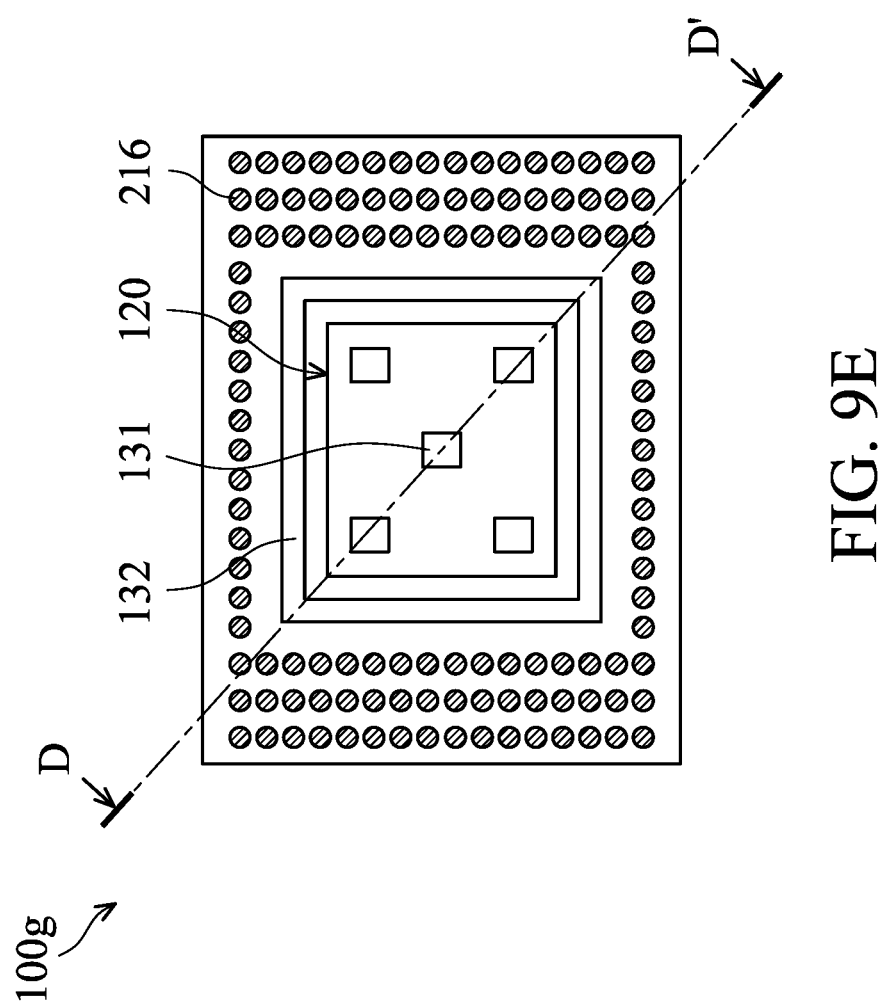

As shown in FIG. 8A, each of the sub-dam portions 131 has a rectangular shape when seen from a top-view. As shown in FIG. 8B, each of the sub-dam portions 131 has a circular shape when seen from a top-view. As shown in FIG. 8C, two columns of the sub-dam portions 131 are arranged over the first die structure 120, and each of the sub-dam portions 131 has a rectangular shape. As shown in FIG. 8D, two columns of the sub-dam portions 131 are arranged over the first die structure 120, and each of the sub-dam portions 131 has a circular shape. As shown in FIG. 8E, there are five sub-dam portions, and each of the sub-dam portions 131 has a rectangular or circle shape.

FIGS. 9A-9E show top-view representations of a package structure 100g, in accordance with some embodiments of the disclosure. The package structure 100g is similar to, or the same as, the package structure 100f shown in FIG. 1I, except that the ring structure 132 surrounds the first die structure 120. Each of the sub-dam portions 131 has a rectangular shape (in FIGS. 9A, 9C and 9E), or circular shape (in FIGS. 9B and 9D) when seen from a top-view.

Figure 10A:
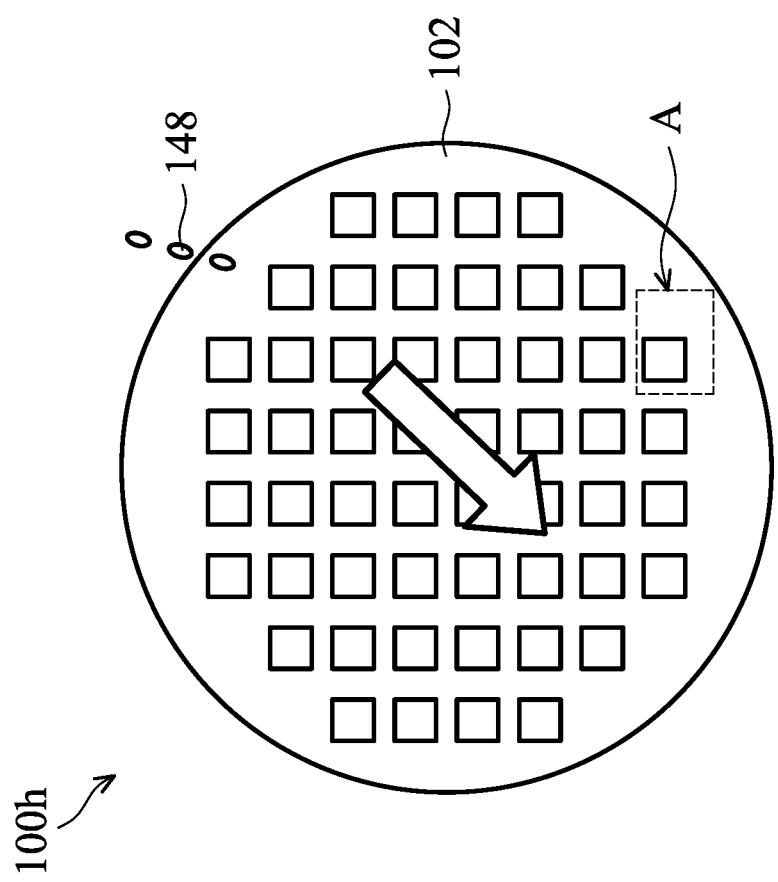
FIG. 10A shows a top-view of representation of a package structure over a substrate, in accordance with some embodiments of the disclosure.
Figure 10B:
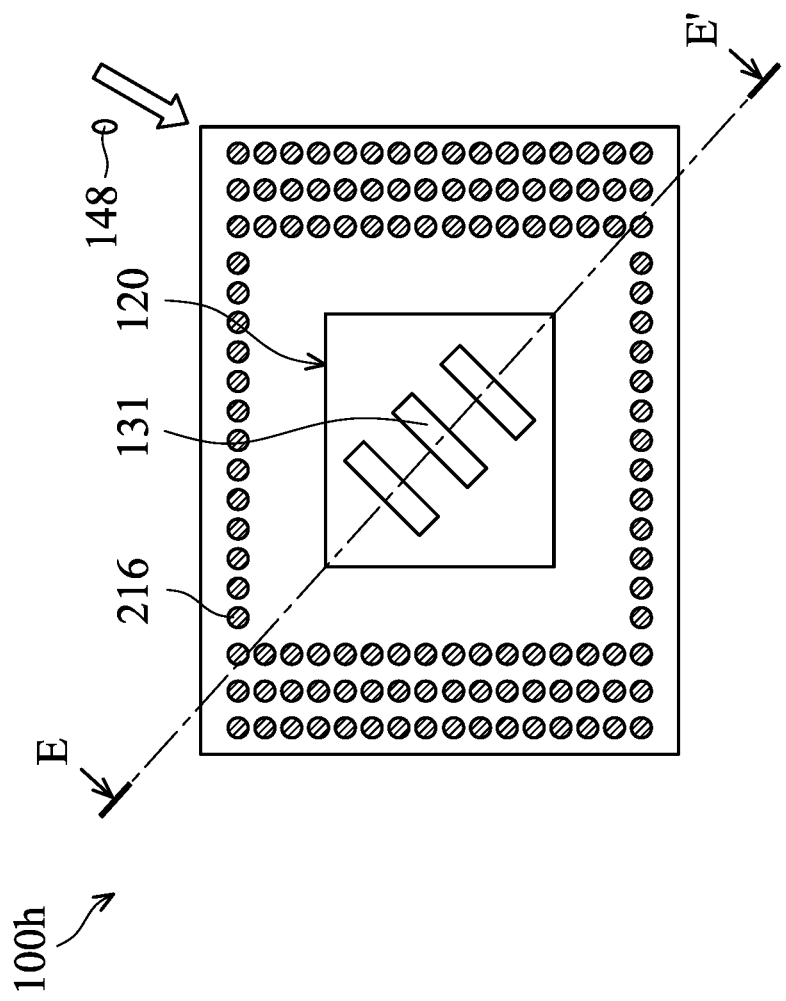
FIG. 10B shows an enlarged region A of FIG. 10A, in accordance with some embodiments of the disclosure.

FIG. 10A shows a top-view of representation of a package structure 100h over the substrate 102, in accordance with some embodiments of the disclosure. FIG. 10B shows an enlarged region A of FIG. 10A, in accordance with some embodiments of the disclosure.

As shown in FIG. 10A, a number of the package structures 100h are formed over the substrate 102. In some embodiments, the substrate 102 is a wafer.

As shown in FIG. 10B, in the package structures 100h, each of the sub-dam portions 131 has a line shape (or strips) when seen from a top-view. The sub-dam portions 131 are parallel to each other. In some embodiments, when the package material 148 fills, the flow direction of the package material 148 is parallel to the line shape (or strips). The advantage of the parallel strips is that the package material 148 may flow along the shape of the parallel strips and therefore the flow of the package material 148 is more fluid.

Embodiments for forming a package structure and method for formation of the same are provided. The package structure includes a die structure over a first interconnect structure. A dam structure is formed over the die structure, and a second interconnect structure is formed over the dam structure. The package layer is formed in the gap between the first interconnect structure and the second interconnect structure. The die structure includes a first region and a second region, the dam structure is formed on the first region, the package layer is formed on the second region. The dam structure is configured to support the second interconnect structure. By forming the dam structure, the package layer can easily fill into the gap between the first interconnect structure and the second interconnect structure. Therefore, voids are prevented from forming in the package structure and the reliability of the package structure is improved.

In some embodiments, a package structure is provided. The package structure includes a die structure formed over a first interconnect structure, and the die structure includes a first region and a second region. The package structure includes a dam structure formed on the first region of the die structure, and a second interconnect structure formed over the die structure and the dam structure. The package structure also includes a package layer formed between the first interconnect structure and the second interconnect structure, and the package layer is formed on the second region of the die structure to surround the dam structure.

In some embodiments, a package structure is provided. The package structure includes a first die structure formed over a first interconnect structure, and the first die structure includes a first surface and a second surface. The package structure also includes a connector formed on the first surface of the die structure, and a dam structure formed on the second surface of the die structure. The package structure further includes a second interconnect structure formed on the dam structure, and a package layer surrounding the dam structure. The second interconnect structure is separated from the first die structure by the package layer. The package structure includes a second die structure formed over the second interconnect structure, and the dam structure is between the first die structure and the second die structure.

In some embodiments, a method for forming a package structure is provided. The method includes forming a first interconnect structure over a carrier substrate, and forming a die structure over the first interconnect structure. The method also includes forming a dam structure over the die structure, and forming a second interconnect structure over the dam structure. There is a space between the first interconnect structure and the second interconnect structure, and there is a gap between the die structure and the second interconnect structure. The method further includes forming a package layer in the space and the gap, and the dam structure is surrounded by the package layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a die structure formed over a first interconnect structure, wherein the die structure comprises a center region and a peripheral region;
   a dam structure formed on the center region of the die structure, wherein the dam structure has a trapezoid shape with a top width and a bottom width, the bottom width is greater than the top width, and the bottom width is in direct contact with the die structure;
   a second interconnect structure formed over the die structure and the dam structure; and
   a package layer formed between the first interconnect structure and the second interconnect structure, wherein the package layer is formed on the peripheral region of the die structure to surround the dam structure, wherein the dam structure is separated from the second interconnect structure by the package layer.

2. The package structure as claimed in claim 1, further comprising:
   a ring structure formed over the first interconnect structure, wherein the die structure is surrounded by the ring structure.

3. The package structure as claimed in claim 2, wherein a top surface of the ring structure is lower than a bottom surface of the dam structure.

4. The package structure as claimed in claim 2, wherein a top surface of the ring structure is lower than a top surface of the die structure.

5. The package structure as claimed in claim 1, wherein all of the sidewall surfaces of the dam structure are in direct contact with the package layer.

6. The package structure as claimed in claim 1, wherein a size of the dam structure is smaller than a size of the die structure.

7. The package structure as claimed in claim 1, further comprising:

a plurality of connectors formed between the first interconnect structure and the second interconnect structure, wherein the connectors are embedded in the package layer.

8. The package structure as claimed in claim 1, wherein the dam structure comprises a plurality of sub-dam portions, and the sub-dam portions are arranged parallel to each other.

9. The package structure as claimed in claim 1, further comprising:
a connector formed between the die structure and the first interconnect structure.

10. A package structure, comprising:
a first die structure formed over a first interconnect structure, wherein the first die structure comprises a first surface and a second surface;
a connector formed on the first surface of the first die structure;
a dam structure formed on the second surface of the first die structure;
a second interconnect structure formed on the dam structure;
a package layer surrounding the dam structure, wherein the second interconnect structure is separated from the first die structure by the package layer, wherein a top surface of the dam structure is in direct contact with the second interconnect structure or the package layer; and
a second die structure formed over the second interconnect structure, wherein the dam structure is between the first die structure and the second die structure.

11. The package structure as claimed in claim 10, further comprising:
a ring structure formed over the first interconnect structure, wherein the first die structure is encircled by the ring structure.

12. The package structure as claimed in claim 11, further comprising:
a plurality of connectors formed between the first interconnect structure and the second interconnect structure, wherein the ring structure is between the dam structure and the connectors.

13. The package structure as claimed in claim 10, wherein the dam structure has a rectangular, a polygonal, a circular, or an oval shape when seen from a top-view.

14. The package structure as claimed in claim 10, wherein the dam structure comprises a plurality of sub-dam portions, wherein a sum of a width of each of the sub-dam portions of the dam structure is smaller than a width of the first die structure.

15. The package structure as claimed in claim 10, wherein the dam structure is on a central area of the second surface of the first die structure.

16. A package structure, comprising:
a die structure formed over a first interconnect structure;
a dam structure formed on a center region of the die structure, wherein a height of the dam structure is smaller than a height of the die structure;
a second interconnect structure formed over the dam structure;
a package layer surrounding the die structure and the dam structure, wherein the dam structure is separated from the second interconnect structure by the package layer; and
a ring structure formed over the first interconnect structure, wherein the dam structure is surrounded by the ring structure.

17. The package structure as claimed in claim 16, wherein a width of the dam structure is smaller than a width of the die structure.

18. The package structure as claimed in claim 16, further comprising:
a plurality of connectors between the die structure and the first interconnect structure, wherein the plurality of connectors are encircled by the ring structure.

19. The package structure as claimed in claim 18, wherein a top surface of the ring structure is higher than top surfaces of the plurality of connectors.

20. The package structure as claimed in claim 16, wherein a top surface of the ring structure is lower than a top surface of the die structure.

* * * * *